(12) United States Patent
Choi

(10) Patent No.: US 11,450,583 B2
(45) Date of Patent: Sep. 20, 2022

(54) SEMICONDUCTOR PACKAGES

(71) Applicant: Samsung Electronics Co., Ltd., Suwon-si (KR)

(72) Inventor: Keun-Ho Choi, Asan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 92 days.

(21) Appl. No.: 16/365,005

(22) Filed: Mar. 26, 2019

(65) Prior Publication Data

US 2020/0105637 A1 Apr. 2, 2020

(30) Foreign Application Priority Data

Sep. 28, 2018 (KR) ........................ 10-2018-0116577

(51) Int. Cl.
*H01L 23/31* (2006.01)
*H01L 23/00* (2006.01)

(52) U.S. Cl.
CPC .......... *H01L 23/3128* (2013.01); *H01L 24/05* (2013.01); *H01L 24/32* (2013.01); *H01L 24/33* (2013.01); *H01L 24/49* (2013.01); *H01L 24/73* (2013.01); *H01L 2224/0556* (2013.01); *H01L 2224/32145* (2013.01); *H01L 2224/32225* (2013.01); *H01L 2224/33104* (2013.01); *H01L 2224/491* (2013.01);
(Continued)

(58) Field of Classification Search
CPC ..... H01L 23/3128; H01L 24/05; H01L 24/32; H01L 24/33; H01L 24/49; H01L 24/73; H01L 2224/0556; H01L 2224/32145; H01L 2224/32225; H01L 2224/33104; H01L 2224/491; H01L 2224/73265; H01L 2225/06506; H01L 2225/0651
See application file for complete search history.

(56) References Cited

U.S. PATENT DOCUMENTS

| 8,525,349 B2 * | 9/2013 | Song ....................... H01L 24/49 438/109 |
| 8,624,297 B2 | 1/2014 | Chun |
| 8,711,055 B2 | 4/2014 | Cho |

(Continued)

FOREIGN PATENT DOCUMENTS

JP 2007201519 A * 8/2007 ....... H01L 23/49575
WO WO-2007049087 A1 * 5/2007 ........... H01L 23/298

*Primary Examiner* — Evren Seven
(74) *Attorney, Agent, or Firm* — Myers Bigel, P.A.

(57) ABSTRACT

Provided is a stacked semiconductor package including a package base substrate including a plurality of signal wires and at least one power wire, wherein a plurality of top downsurface connecting pads and a plurality of bottom surface connecting pads are on a top surface and a bottom surface of the package base substrate, respectively; and a plurality of semiconductor chips that are sequentially stacked on the package base substrate and are electrically connected to the top surface connecting pads, the plurality of semiconductor chips including a first semiconductor chip that is a bottommost semiconductor chip, and a second semiconductor chip that is on the first semiconductor chip, wherein the signal wires are arranged apart from a portion of the package base substrate, the first portion that overlaps a first edge of the first semiconductor chip, the first edge overlapping the second semiconductor chip in a vertical direction.

12 Claims, 24 Drawing Sheets

(52) U.S. Cl.
CPC ............... *H01L 2224/73265* (2013.01); *H01L 2225/0651* (2013.01); *H01L 2225/06506* (2013.01)

(56) References Cited

U.S. PATENT DOCUMENTS

| | | | |
|---|---|---|---|
| 8,743,560 B2 | 6/2014 | Kim | |
| 8,906,800 B2 | 12/2014 | Feldman | |
| 9,502,345 B2* | 11/2016 | Youn | H01L 24/49 |
| 9,847,319 B2* | 12/2017 | Song | H01L 25/0655 |
| 2005/0093167 A1* | 5/2005 | Saeki | H01L 24/49 |
| | | | 438/629 |
| 2005/0121802 A1* | 6/2005 | Kawano | H01L 25/0657 |
| | | | 257/777 |
| 2007/0023886 A1* | 2/2007 | Hedler | H01L 24/85 |
| | | | 257/E29.022 |
| 2007/0114672 A1 | 5/2007 | Higashino | |
| 2007/0170573 A1* | 7/2007 | Kuroda | H01L 24/83 |
| | | | 257/E21.705 |
| 2010/0155919 A1* | 6/2010 | Song | H01L 23/5387 |
| | | | 257/690 |
| 2010/0193930 A1* | 8/2010 | Lee | H01L 24/24 |
| | | | 257/E23.173 |
| 2010/0238696 A1* | 9/2010 | Baek | H01L 25/105 |
| | | | 257/E23.141 |
| 2010/0244227 A1* | 9/2010 | Kim | H01L 25/0652 |
| | | | 257/692 |
| 2010/0258930 A1* | 10/2010 | Oh | H01L 25/105 |
| | | | 257/E23.141 |
| 2010/0265751 A1* | 10/2010 | Hong | H05K 3/284 |
| | | | 257/E23.141 |
| 2010/0270689 A1* | 10/2010 | Kim | H01L 25/18 |
| | | | 257/777 |
| 2010/0283140 A1* | 11/2010 | Kim | H01L 23/3128 |
| | | | 438/107 |
| 2010/0314740 A1* | 12/2010 | Choi | H01L 25/0657 |
| | | | 257/E23.141 |
| 2011/0104888 A1* | 5/2011 | Kim | H01L 24/05 |
| | | | 257/E21.585 |
| 2012/0001347 A1* | 1/2012 | Lee | H01L 24/49 |
| | | | 257/E23.141 |
| 2012/0080806 A1* | 4/2012 | Song | H01L 22/32 |
| | | | 257/E23.024 |
| 2013/0021760 A1* | 1/2013 | Kim | H01L 25/0657 |
| | | | 257/773 |
| 2013/0049221 A1* | 2/2013 | Han | H01L 21/561 |
| | | | 257/E23.116 |
| 2013/0049228 A1* | 2/2013 | Nam | H01L 25/0657 |
| | | | 257/777 |
| 2013/0056882 A1* | 3/2013 | Kim | H01L 25/105 |
| | | | 257/E23.141 |
| 2013/0200530 A1* | 8/2013 | Song | H01L 25/074 |
| | | | 257/777 |
| 2013/0241044 A1* | 9/2013 | Kim | H01L 23/4334 |
| | | | 257/E23.18 |
| 2013/0277831 A1* | 10/2013 | Yoon | H01L 24/13 |
| | | | 257/737 |
| 2014/0008772 A1* | 1/2014 | Cho | H01L 24/97 |
| | | | 257/659 |
| 2014/0008796 A1* | 1/2014 | Choi | H01L 23/5221 |
| | | | 257/738 |
| 2014/0210108 A1* | 7/2014 | Park | H01L 24/06 |
| | | | 257/777 |
| 2017/0025385 A1* | 1/2017 | Song | H01L 23/562 |
| 2018/0004318 A1 | 1/2018 | Ahmed | |
| 2019/0103409 A1* | 4/2019 | Xu | H03K 19/17736 |

* cited by examiner

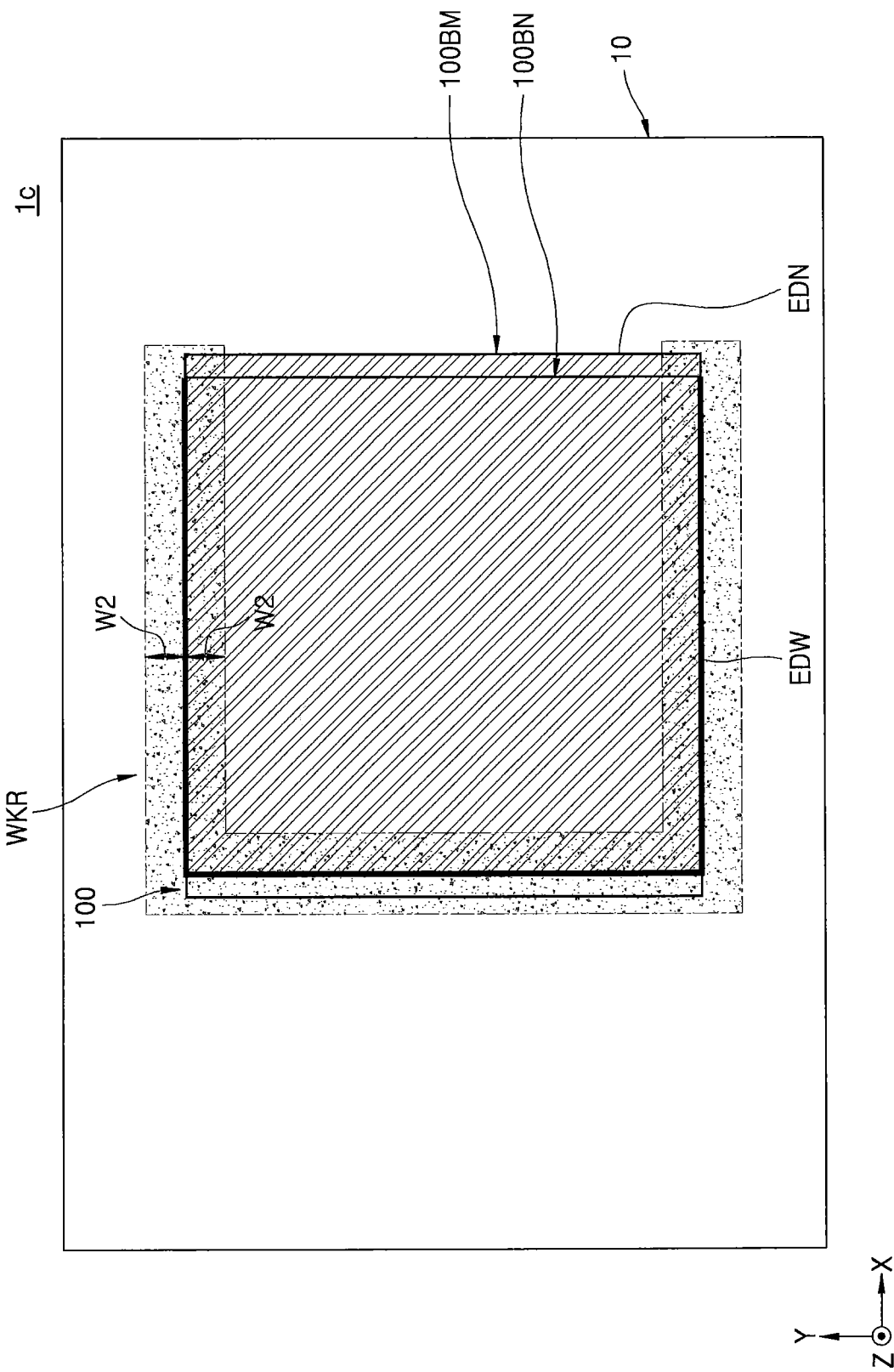

SEMICONDUCTOR PACKAGES

CROSS-REFERENCE TO RELATED APPLICATION

This application claims priority under 35 U.S.C. § 119 to Korean Patent Application No. 10-2018-0116577, filed on Sep. 28, 2018, in the Korean Intellectual Property Office, the entire contents of which are incorporated herein by reference.

BACKGROUND

The inventive concepts relate to semiconductor packages, and, more particularly, to stacked semiconductor packages including a plurality of stacked semiconductor chips.

Electronic devices are becoming more compact and lighter in accordance with the rapid development of the electronic industry and users' demands. Accordingly, there is a demand for high integration and increased capacity of semiconductor devices, which are core parts of electronic devices. However, there is a limit for increasing the integration of semiconductor devices. Accordingly, a semiconductor package including a plurality of semiconductor chips is being developed to achieve a large capacity.

In addition, as the demand for increasing the capacity of semiconductor devices becomes higher, stacked semiconductor packages are being developed in which a plurality of semiconductor chips included in a semiconductor package are stacked.

SUMMARY

The inventive concepts provide a stacked semiconductor package having improved reliability by preventing and/or reducing defects occurring in a package base substrate in which a plurality of semiconductor chips are stacked.

In order to accomplish the above object, the inventive concepts provide a stacked semiconductor package as described herein.

According to an aspect of the inventive concepts, there is provided a stacked semiconductor package including a package base substrate in which a plurality of top surface connecting pads and a plurality of bottom surface connecting pads are on a top surface and a bottom surface, respectively, wherein the package base substrate includes a plurality of signal wires and at least one power wire; and a plurality of semiconductor chips that are sequentially stacked on the package base substrate and are electrically connected to the top surface connecting pads, the plurality of semiconductor chips including a first semiconductor chip that is the bottommost semiconductor chip of the plurality of semiconductor chips, and a second semiconductor chip that is on the first semiconductor chip, wherein the signal wires are spaced apart from a first portion of the package base substrate that overlaps a first edge of the first semiconductor chip, the first edge overlapping the second semiconductor chip in a vertical direction.

According to another aspect of the inventive concepts, there is provided a stacked semiconductor package including a package base substrate including a plurality of layers including a top layer and a bottom layer and includes a plurality of signal wires and at least one power wire in at least some of the layers, and a ball land in the bottom layer and having a first width; and a plurality of semiconductor chips stacked on the package base substrate and including a first semiconductor chip that is the bottommost semiconductor chip of the plurality of semiconductor chips, and a second semiconductor chip that is on the first semiconductor chip, wherein the package base substrate includes an overlap region including a first region and a second region, wherein the first region has a second width equal to or greater than the first width and extends under a bottom surface of the first semiconductor chip from a first portion of the package base substrate that overlaps a first edge of the first semiconductor chip, the first edge overlapping the second semiconductor chip in a vertical direction, wherein the second region has the second width and extends outside the bottom surface of the first semiconductor chip from the first portion of the package base substrate, and wherein, in the bottom layer, the signal wires are not in the second region.

According to another aspect of the inventive concepts, there is provided a stacked semiconductor package including a package base substrate including a plurality of layers including a top layer, a bottom layer, and a plain layer between the top layer and the bottom layer and includes a plurality of signal wires and at least one power wire in at least some of the layers, and a ball land in the bottom layer and having a first width; and a plurality of semiconductor chips stacked on the package base substrate and including a first semiconductor chip that is the bottommost semiconductor chip of the plurality of semiconductor chips, and a second semiconductor chip that is on the first semiconductor chip, wherein the package base substrate includes an overlap region extending by a second width equal to or greater than the first width in horizontal directions from a portion of the package base substrate, the portion overlapping a first edge of the first semiconductor chip that overlaps the second semiconductor chip in a vertical direction, and, wherein, in the bottom layer, the signal wires are spaced horizontally apart from the overlap region.

BRIEF DESCRIPTION OF THE DRAWINGS

Embodiments of the inventive concepts will be more clearly understood from the following detailed description taken in conjunction with the accompanying drawings in which:

FIG. 3B is a plan view thereof;

DETAILED DESCRIPTION

Figure 1A:
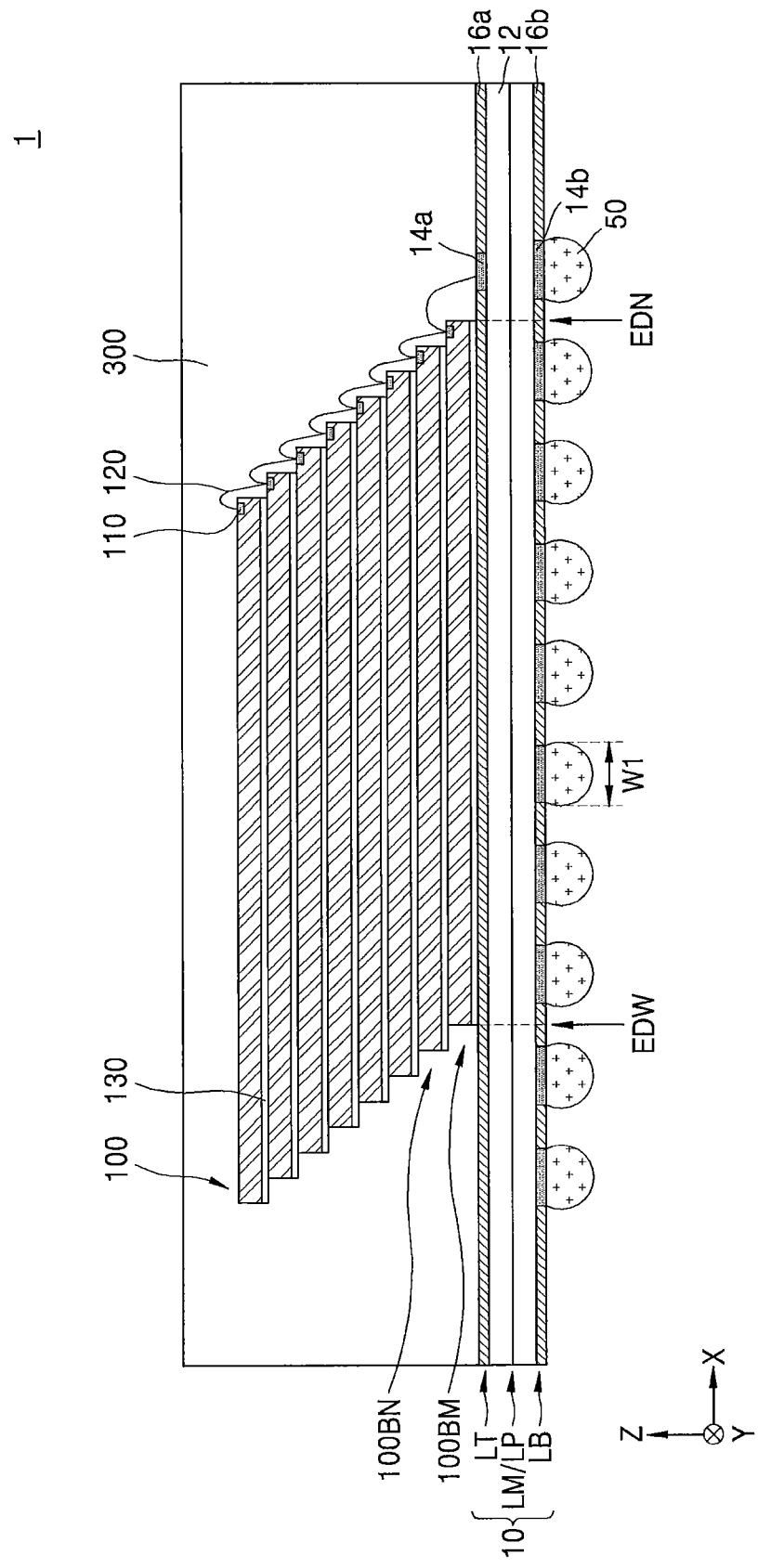
FIGS. 1A and 1B are cross-sectional views of a stacked semiconductor package according to an example embodiment of the inventive concepts.
Figure 1B:
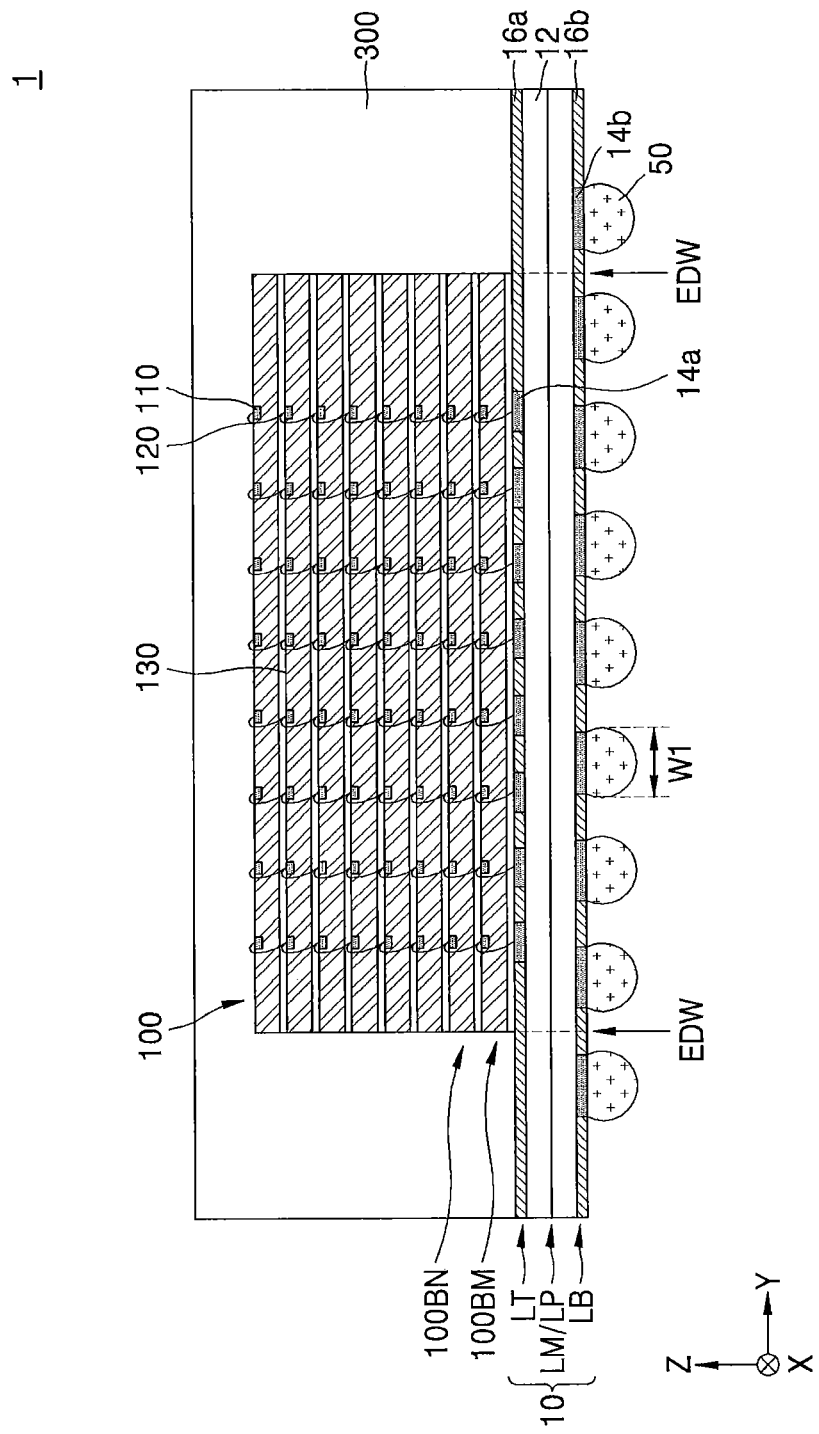
Figure 1C:
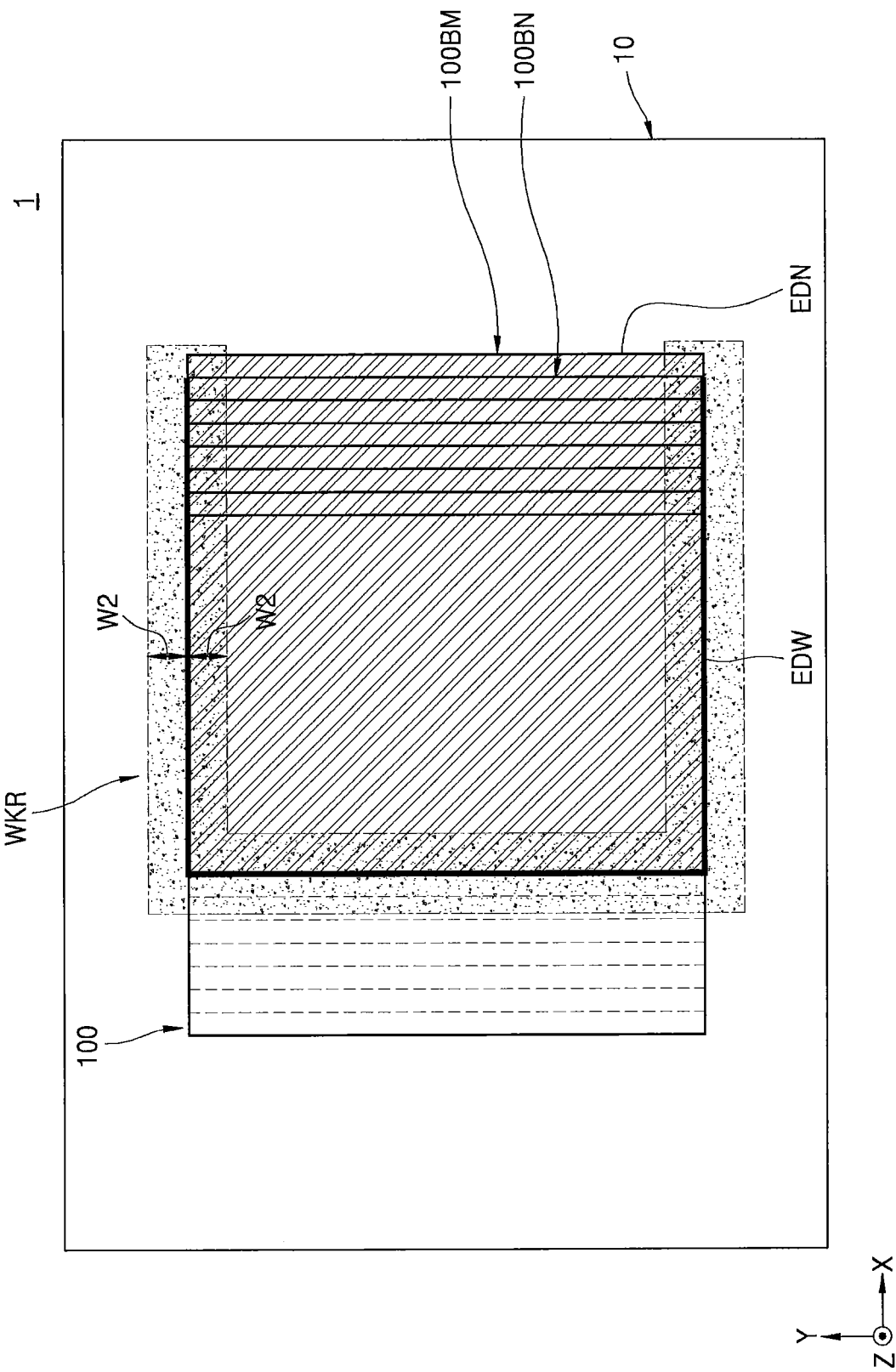
FIG. 1C is a plan view thereof.

FIGS. 1A and 1B are cross-sectional views of a stacked semiconductor package 1 according to an example embodiment of the inventive concepts, and FIG. 1C is a plan view thereof. In detail, FIG. 1A is a cross-sectional view taken along the X-Y plane, and FIG. 1B is a cross-sectional view taken along the Y-Z plane.

Referring to FIGS. 1A through 1C, a stacked semiconductor package 1 includes a package base substrate 10 and a plurality of semiconductor chips 100.

The package base substrate 10 may be, for example, a printed circuit board. For example, the package base substrate 10 may be a double-sided printed circuit board. When the package base substrate 10 is a double-sided printed circuit board, a bottom layer LB and a top layer LT may be disposed on the bottom surface and the top surface of the package base substrate 10, respectively. The package base substrate 10 may include at least one base layer 12, a plurality of top surface connecting pads 14a and a plurality of bottom surface connecting pads 14b that are disposed on the top surface and the bottom surface, respectively. In some embodiments, the package base substrate 10 may include a plurality of base layers 12 that are stacked.

For example, the package base substrate 10 may be a multi-layer printed circuit board. When the package base substrate 10 is a multilayer printed circuit board, the bottom layer LB and the top layer LT may be disposed on the bottom surface and the top surface of the package base substrate 10, respectively. Furthermore, a middle layer LM and/or a plain layer LP may be disposed in the package base substrate 10. The plain layer LP may be a type of the middle layer LM. However, in this specification, the plain layer LP and a middle layer LM are separately described.

In some embodiments, a top surface solder resist layer 16a and a bottom surface solder resist layer 16b may be disposed on the top surface and the bottom surface of the package base substrate 10. At least a portion of each of the plurality of top surface connecting pads 14a may be exposed on the top surface of the package base substrate 10 without being covered by the top surface solder resist layer 16a. At least a portion of each of the plurality of bottom surface connecting pads 14b may be exposed on the bottom surface of the package base substrate 10 without being covered by the bottom surface solder resist layer 16b. In some embodiments, portions of the plurality of top surface connecting pads 14a and the plurality of bottom surface connecting pads 14b adjacent to edges thereof may be covered by the top surface solder resist layer 16a and the bottom surface solder resist layer 16b, and the remaining portions of the plurality of top surface connecting pads 14a and the plurality of bottom surface connecting pads 14b may be exposed without being covered.

Each of the plurality of bottom surface connecting pads 14b may have a first width W1 (e.g., in the X direction). A plurality of external connection terminals 50 may be attached to the plurality of bottom surface connecting pads 14b, respectively. The external connection terminals 50 may be, for example, solder balls or bumps. The external connection terminals 50 may electrically connect the stacked semiconductor package 1 and an electronic device. Since the external connection terminals 50 are attached to the bottom surface connecting pads 14b, and thus the bottom surface connecting pads 14b may also be referred to as a ball lands.

In some embodiments, the package base substrate 10 may not include the top surface solder resist layer 16a and the bottom surface solder resist layer 16b. In some embodiments, the top surface connecting pads 14a and the bottom surface connecting pads 14b may be embedded within the at least one base layer 12, and thus the surfaces of the top surface connecting pads 14a and the bottom surface connecting pads 14b may be co-planar with the top surface and the bottom surface of the at least one base layer 12.

In some embodiments, the at least one base layer 12 may include at least one material selected from among phenolic resins, epoxy resins, and polyimide. For example, at least one of the base layers 12 may include at least one material selected from among flame retardant 4 (FR4), tetrafunctional epoxy, polyphenylene ether, epoxy/polyphenylene oxide, bismaleimide triazine (BT), Thermount, cyanate ester, polyimide, and liquid crystal polymers.

To connect the top surface connecting pads 14a and the bottom surface connecting pads 14b, internal wires (not shown) disposed between the at least one base layer 12 and conductive vias (not shown) penetrating through the at least one base layers 12 may be disposed in the package base substrate 10. In some embodiments, a wiring pattern that connects the top surface connecting pads 14a and/or the bottom surface connecting pads 14b to the conductive vias may be further provided on the top surface and/or the bottom surface of the package base substrate 10.

The top surface connecting pads 14a, the bottom surface connecting pads 14b, the internal wires and/or the wiring pattern may include, for example, electrolytically deposited (ED) copper foils, rolled-annealed (RA) copper foils, stainless steel foils, aluminum foils, ultra-thin copper foils, sputtered copper, copper alloys, and the like. The conductive vias may include, for example, copper, nickel, stainless steel, and/or beryllium copper. The wiring pattern may constitute the bottom layer LB or the top layer LT, and the internal wires may constitute the middle layer LM or the plain layer LP. The wiring pattern and the internal wires may be together referred to as wiring lines. The wiring lines may include a signal wire (e.g., SLB in FIG. 7A, SL in FIG. 8A, and/or SLa in FIG. 9B) and/or a power wire (e.g., PGB in FIG. 7B and/or PG in FIG. 8B).

The semiconductor chips 100 may be sequentially stacked on the package base substrate 10 in the vertical direction (e.g., the Z direction). The semiconductor chips 100 may be stacked in a step-like shape with a substantially constant interval in the horizontal direction (e.g., the X direction).

The semiconductor chip 100 may include a semiconductor substrate. The semiconductor substrate may include, for example, silicon (Si). In some embodiments, the semiconductor substrate may include a semiconductor element like germanium (Ge) or a compound semiconductor like silicon carbide (SiC), gallium arsenide (GaAs), indium arsenide (InAs), and indium phosphide (InP). In some embodiments, the semiconductor substrate may have a silicon-on-insulator (SOI) structure. For example, the semiconductor substrate may include a buried oxide (BOX) layer. The semiconductor substrate may include a conductive region, e.g., a well doped with an impurity. The semiconductor substrate may have various device isolation structures, such as, for example, a shallow trench isolation (STI) structure. The semiconductor substrate may have an active surface and an inactive surface opposite to the active surface.

A semiconductor device including a plurality of individual devices of various types may be formed on the active surface of the semiconductor chip 100. The individual devices may include various types of microelectronic devices, e.g., a metal-oxide-semiconductor field effect transistor (MOSFET) like a complementary metal-insulator-semiconductor (CMOS) transistor, a system large scale integration (LSI), an image sensor like a CMOS imaging sensor (CIS), a micro-electro-mechanical system (MEMS), an active device, a passive device, etc., though the inventive concepts are not limited thereto. The individual devices may be electrically connected to the conductive region of a semiconductor substrate therebetween. The semiconductor device may further include at least two of the individual devices, and/or conductive wires and/or conductive plugs for electrically connecting the individual devices to the conductive region of the semiconductor substrate. In addition, the individual devices may be electrically separated from other neighboring individual devices by insulating films.

The semiconductor chip 100 may be, for example, a semiconductor memory chip. For example, the semiconductor memory chip may be a non-volatile semiconductor memory chip like a flash memory, a phase-change random access memory (PRAM), a magnetoresistive random access memory (MRAM), a ferroelectric random access memory (FeRAM), or a resistive random access memory (RRAM). The flash memory may be, for example, a V-NAND flash memory. In some embodiments, the semiconductor chip 100 may be a volatile semiconductor memory chip like a dynamic random access memory (DRAM) or a static random access memory (SRAM).

Each of the semiconductor chips 100 may include one or more chip pads 110 on the active surface. Each of the semiconductor chips 100 may be stacked on the package base substrate 10, such that the active surface faces upward, that is, the opposite direction to the package base substrate 10 (e.g., on an opposite side of the semiconductor chip 100 from the package base substrate 10). A plurality of bonding wires 120 may be attached between the chip pads 110 and the top surface connecting pads 14a. The semiconductor chips 100 may be electrically connected to the package base substrate 10 through the bonding wires 120.

In some embodiments, the bonding wires 120 may be sequentially and respectively connected from the chip pads 110 of the topmost semiconductor chip 100 (e.g., the semiconductor chip 100 farthest from the package base substrate 10) to the chip pads 110 of the bottommost semiconductor chip 100, and may then be connected to the top surface connecting pads 14a (e.g., the semiconductor chip 100 closest to the package base substrate 10). In some embodiments, the bonding wires 120 may be respectively connected between the chip pads 110 of the semiconductor chips 100 and the top surface connecting pads 14a.

The semiconductor chips 100 may be attached on a structure therebelow via a die adhesive film 130 attached therebetween. For example, the bottommost semiconductor chip 100 of the semiconductor chips 100 may be mounted over the package base substrate 10 with the die adhesive film 130 therebetween, and each of the remaining semiconductor chips 100 may be attached to another semiconductor chip 100 therebelow via the die adhesive film 130 therebetween.

The die adhesive film 130 may include, for example, an inorganic adhesive and/or a polymer adhesive. The polymer adhesive may include, for example, a thermosetting polymer and/or a thermoplastic polymer. The thermosetting polymer has a 3-dimensional cross-link structure after being formed by heating and molding a monomer and is not softened by reheating. On the other hand, thermoplastic polymer is a polymer that exhibits plasticity by heating and has a linear polymer structure. In some embodiments, the polymer adhesive may include a hybrid type obtained by mixing the thermosetting polymer and the thermoplastic polymer.

In some embodiments, the semiconductor chip 100 may further include a controller chip on the package base substrate 10 or on the topmost semiconductor chip 100 of the semiconductor chips 100.

A controller may be embedded in the controller chip. The controller may control accesses to data stored in the semiconductor chips 100. In other words, the controller may control write/read operations of the semiconductor chips 100, e.g., flash memories, according to control commands from an external host. In some embodiments, the controller may be configured as a separate control semiconductor chip, e.g., an application specific integrated circuit (ASIC). In some embodiments, the controller may perform wear leveling, garbage collection, bad block management, and/or error correcting code (ECC) for the non-volatile semiconductor memory chip.

A mold layer 300 covering the top surface of the package base substrate 10 and surrounding the semiconductor chips 100 and the bonding wires 120 may be disposed on the package base substrate 10. The mold layer 300 may include, for example, epoxy molding compound (EMC).

The semiconductor chips 100 include a first semiconductor chip 100BM, which is the bottommost semiconductor chip (e.g., the semiconductor chip 100 that is closest to the package base substrate 10), and a second semiconductor chip 100BN, which is stacked on the first semiconductor chip 100BM. From among the semiconductor chips 100, edges of the first semiconductor chip 100BM may include a first edge EDW and a second edge EDN on same plane (e.g., an X-Y plane). The first edge EDW refers to an edge, or a portion of an edge, of the first semiconductor chip 100BM that overlaps the second semiconductor chip 100BN in the vertical direction (e.g., the Z direction), and the second edge EDN refers to an edge, or a portion of an edge, of the first semiconductor chip 100BM that does not overlap the second semiconductor chip 100BN thereabove in the vertical direction (Z direction). In other words, an edge or an inner portion of the second semiconductor chip 100BN is disposed on the first edge EDW of the first semiconductor chip 100BM, and an edge or an inner portion of the second semiconductor chip 100BN is not disposed on the second edge EDN of the first semiconductor chip 100BM. In FIG. 1C, for convenience of distinction, the first edge EDW is indicated by a thick solid line, and the second edge EDN is indicated by a thin solid line.

For example, from among the four edges of the first semiconductor chip 100BM, one entire edge and portions of other two edges may be first edges EDW, and the remaining portions of the other two edges and another entire edge may be second edges EDN.

The first edge EDW may be referred to as a weak edge EDW, and the second edge EDN may be referred to as a non-weak edge.

A portion of the package base substrate 10 from a portion of the package base substrate 10 overlapping the first edge EDW in the vertical direction (e.g., the Z direction) to the second width W2 in the horizontal direction (e.g., X direction or Y direction) may be a weak region WKR (see FIG. 1C). In some embodiments, the weak region WKR may be referred to as an overlap region WKR. In some embodiments, the weak region WKR may include a portion of the package base substrate 10 that is the second width W2 from either side, horizontally, of the first edge EDW of the first semiconductor chip 100BM. In some embodiments, the first edge EDW may be disposed in an interior portion that is in the middle, horizontally, of the weak region WKR. In other words, the width of the weak region WKR may be twice the second width W2. For example, the second width W2 may have a value equal to or greater than that of the first width W1. For example, the second width W2 may be equal to or twice the first width W1. In some embodiments, the second width W2 and the first width W1 may have the same value. In some other embodiments, the second width W2 may have a value twice that of the first width W1. In other words, the width of the weak region WKR may be 2 to 4 times the first width W1.

In some embodiments, the package base substrate 10 may not have a signal wire (e.g., SLB in FIG. 7A and/or SL in FIG. 8A) disposed in the weak region WKR. In some embodiments, the package base substrate 10 may not have the signal wire SL disposed in the weak region WKR in some of the bottom layer LB, the middle layer LM, and the top layer LT and may have a signal wire (e.g., SLa in FIG. 9B) that is at least partially disposed in the weak region WKR. The signal wire SLa that is at least partially disposed in the weak region WKR may be referred to as an across signal wire. In some embodiments, the package base substrate 10 may have a power wire (e.g., PGB in FIG. 7B and/or PG in FIG. 8B) disposed in the weak region WKR.

The weak region WKR, the signal wires SLB, SL, and SLa, and the power wires PGB and PG will be described in detail with reference to FIGS. 8A to 9B. The signal wires SLB, SL, and SLa may be used for inputting/outputting data signals, inputting clock signals, and inputting control signals to the semiconductor chips 100, and the power wires PGB and PG may provide power or ground for operation of the semiconductor chips 100.

Figure 2A:
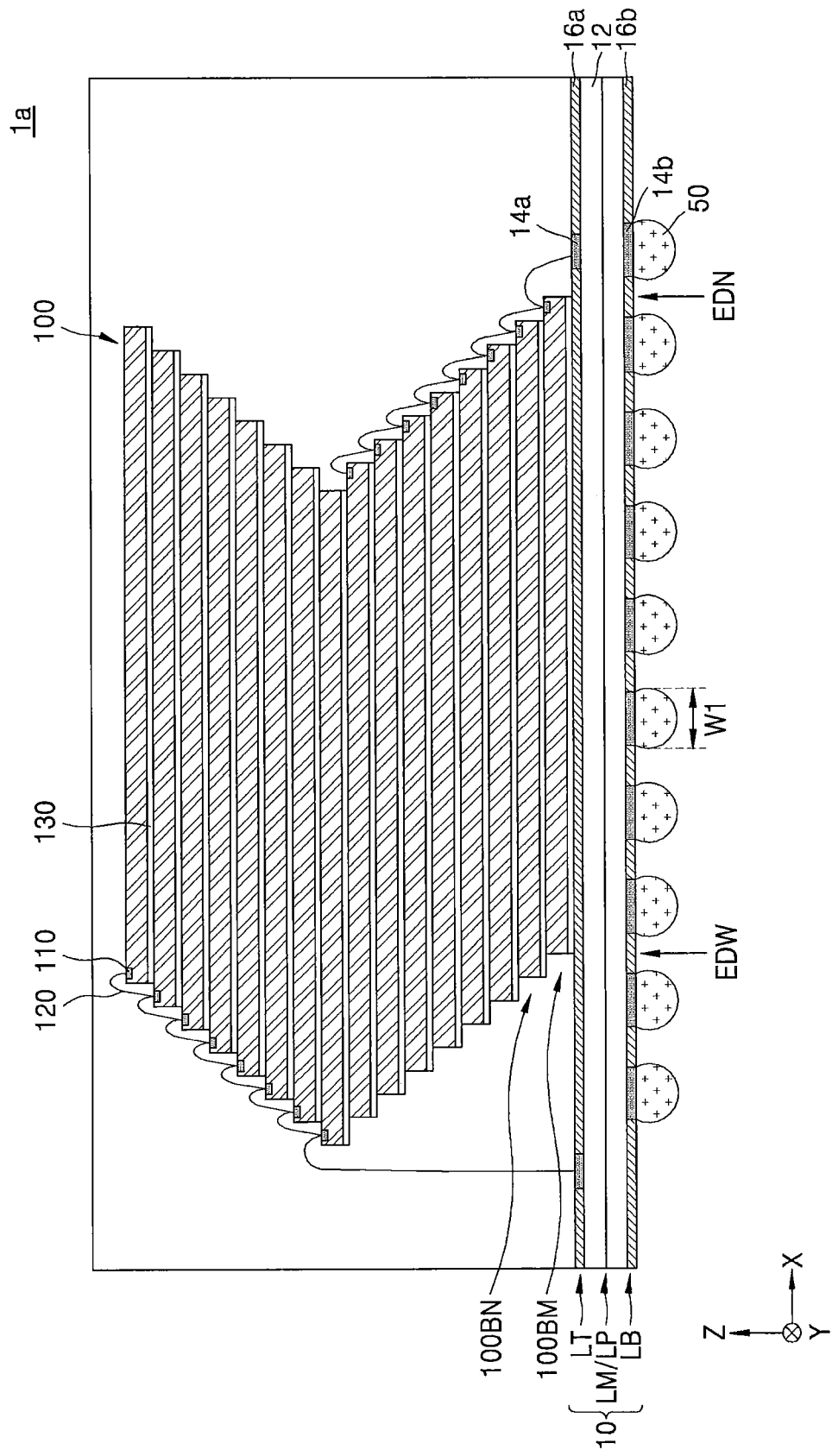
FIGS. 2A and 2B are cross-sectional views of stacked semiconductor packages according to an example embodiments of the inventive concepts.
Figure 2B:
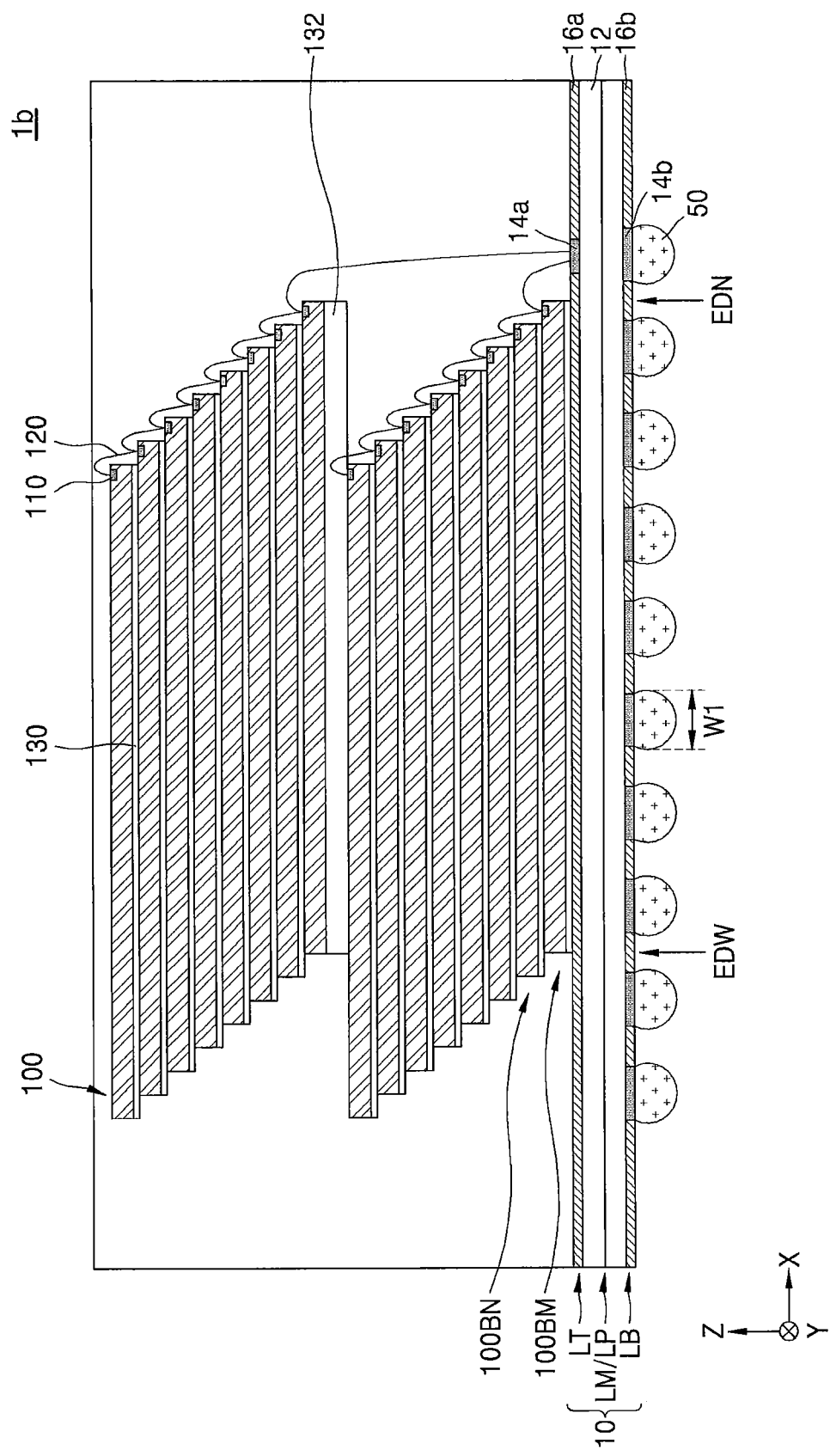

FIGS. 2A and 2B are cross-sectional views of stacked semiconductor packages according to example embodiments of the inventive concepts. Descriptions of FIGS. 2A and 2B that are identical to those given above with reference to FIGS. 1A to 1C may be omitted.

Referring to FIG. 2A, a stacked semiconductor package 1a includes the package base substrate 10 and the semiconductor chips 100.

The semiconductor chips 100 may be sequentially stacked on the package base substrate 10 in the vertical direction (e.g., the Z direction). The semiconductor chips 100 may be stacked in a step-like shape at substantially constant intervals in the horizontal directions (e.g., the X direction and the −X direction). In detail, in the stacked semiconductor package 1a, some of the semiconductor chips 100 may be stacked on the package base substrate 10 in a step-like shape at substantially constant intervals in the −X direction, and some other of the semiconductor chips 100 may be stacked thereabove in a step-like shape at substantially constant intervals in the X direction.

Although not shown, the semiconductor chips 100 may be alternately stacked in groups at least two times on the package base substrate 10 in step-like shapes in the −X direction and the X direction, such that different groups of the semiconductor chips 100 are arranged at substantially constant intervals.

Referring to FIG. 2B, a stacked semiconductor package 1b includes the package base substrate 10 and the semiconductor chips 100.

The semiconductor chips 100 may be sequentially stacked on the package base substrate 10 in the vertical direction (e.g., the Z direction). The semiconductor chips 100 may be stacked in a step-like shape with a substantially constant interval in the horizontal direction (e.g., the −X direction). In detail, in the stacked semiconductor package 1b, a first group of the semiconductor chips 100 may be stacked on the package base substrate 10 in a step-like shape at substantially constant intervals in the −X direction, and a second group of the semiconductor chips 100 may be stacked in a step-like shape at substantially constant intervals in the −X direction to overhang above the first group of the semiconductor chips 100.

In some embodiments, a thick die adhesive film 132 may be disposed between the first group of semiconductor chip 100 and the bottommost semiconductor chip 100 from among the second group of semiconductor chips 100 stacked thereabove. The thickness of the thick die adhesive film 132 may be greater than the thickness of the die adhesive film 130.

Although not shown, the semiconductor chips 100 may be stacked on the package base substrate 10 in step-like shapes alternately at least three times in the −X direction, such that different groups of the semiconductor chips 100 are arranged at substantially constant intervals.

The plan layouts of portions of the stacked semiconductor package 1a and the stacked semiconductor package 1b, that is, the plan layouts of package base substrates 10 of the stacked semiconductor package 1a and the stacked semiconductor package 1b and lower ones of the semiconductor chips 100 are substantially similar to that shown in FIG. 1C, and thus a separate illustration thereof will be omitted.

In detail, the semiconductor chips 100 included in the stacked semiconductor packages 1a and 1b shown in FIGS. 2A and 2B include the first semiconductor chip 100BM, which is the bottommost semiconductor chip 100 (e.g., the semiconductor chip 100 that is closest to the package base substrate 10), and the second semiconductor chip 100BN, which is the second bottommost semiconductor chip 100 stacked on the first semiconductor chip 100BM. Even when there is a change in the step-like shape in which some of upper semiconductor chips 100 are stacked, since the second semiconductor chip 100BN is stacked on the first semiconductor chip 100BM in the same shape, the first edge EDW of the first semiconductor chip 100BM may include one entire edge and portions of other two edges from among the four edges of the first semiconductor chip 100BM and the second edge EDN may include the remaining portions of the two other edges and another entire edge, in a similar manner as shown in FIG. 1C.

Therefore, the weak region WKR shown in FIG. 1C is determined by the stacked shape of the first semiconductor chip 100BM, which is the bottommost semiconductor chip 100, and the second semiconductor chip 100BN, which is the second bottommost semiconductor chip 100, and the stacked shape of the other semiconductor chips 100 stacked thereabove may not influence the determination of the weak region WKR.

Figure 3A:
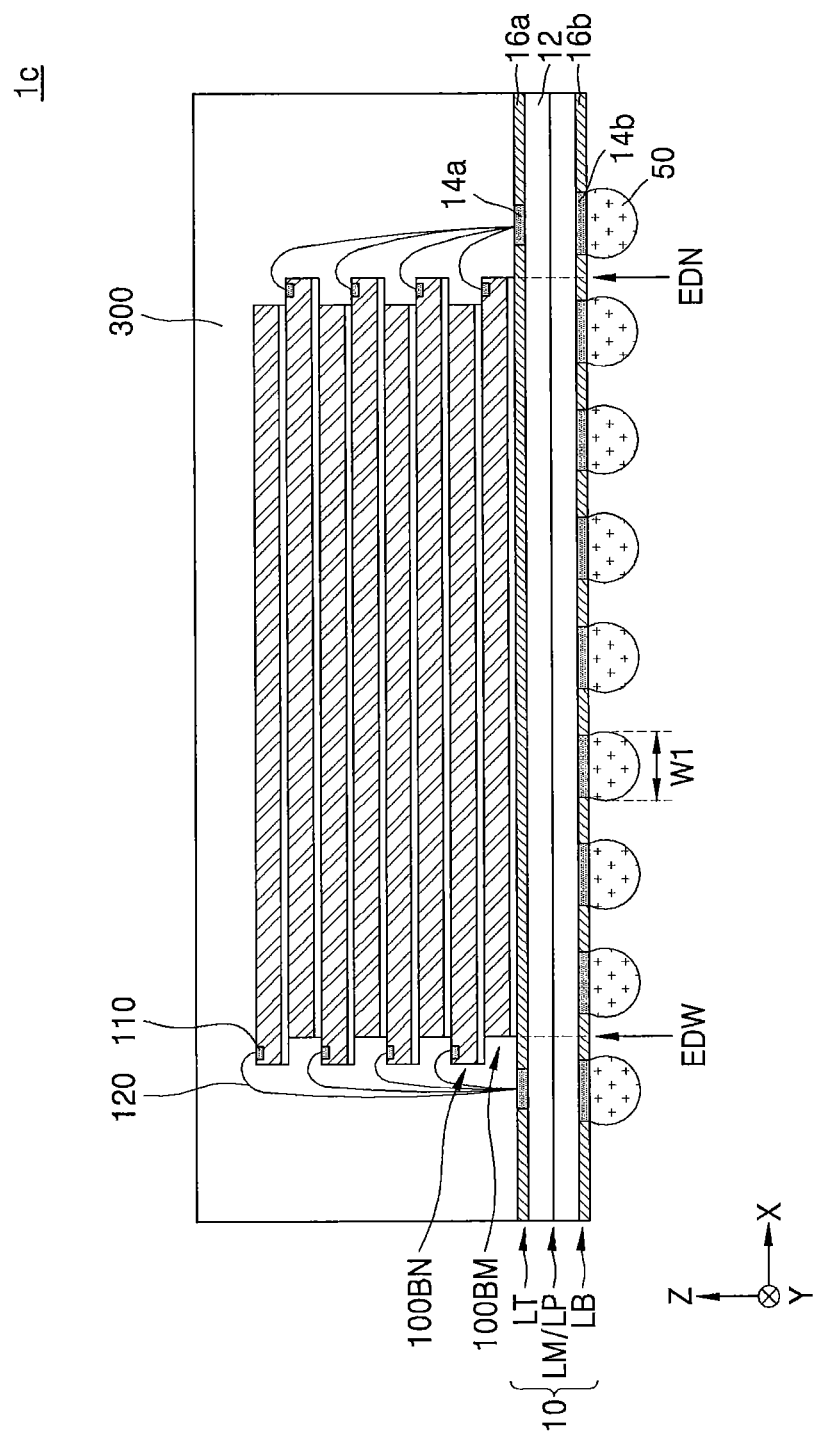
FIG. 3A is a cross-sectional view of a stacked semiconductor package according to an example embodiment of the inventive concepts.

FIG. 3A is a cross-sectional view of a stacked semiconductor package 1c according to an example embodiment of the inventive concepts, and FIG. 3B is a plan view thereof. Descriptions of FIGS. 3A and 3B that are identical to those given above with reference to FIGS. 1A to 1C may be omitted.

Referring to FIGS. 3A and 3B, a stacked semiconductor package 1c includes the package base substrate 10 and the semiconductor chips 100. The semiconductor chips 100 may be sequentially stacked on the package base substrate 10 in the vertical direction (e.g., Z direction). The semiconductor chips 100 may be stacked and alternately shifted in the horizontal directions (e.g., the X direction and the −X direction) at substantially constant intervals. In detail, in the stacked semiconductor package 1c, the semiconductor chips 100 may be stacked on the package base substrate 10 in the vertical direction (Z direction) at substantially constant intervals that alternate in the −X direction and the X direction.

The semiconductor chips 100 include a first semiconductor chip 100BM, which is the bottommost semiconductor chip (e.g., the semiconductor chip 100 that is the closest to the package base substrate 10), and a second semiconductor chip 100BN, which is stacked on the first semiconductor chip 100BM. From among the semiconductor chips 100, on the plane (X-Y plane), edges of the first semiconductor chip 100BM may include a first edge EDW and a second edge EDN. The first edge EDW refers to an edge of the first semiconductor chip 100BM that overlaps the second semiconductor chip 100BN in the vertical direction (e.g., the Z direction), and the second edge EDN refers to an edge of the first semiconductor chip 100BM that does not overlap the second semiconductor chip 100BN thereabove in the vertical direction (e.g., the Z direction). In other words, an edge or an inner portion of the second semiconductor chip 100BN is disposed on the first edge EDW of the first semiconductor chip 100BM, and an edge or an inner portion of the second semiconductor chip 100BN is not disposed on the second edge EDN of the first semiconductor chip 100BM.

For example, from among the four edges of the first semiconductor chip 100BM, one entire edge and portions of other two edges may be first edges EDW, and the remaining portions of the other two edges and another entire edge may be second edges EDN.

A portion of the package base substrate 10 from a portion of the package base substrate 10 overlapping the first edge EDW in the vertical direction (e.g., the Z direction) to the second width W2 in the horizontal direction (e.g., the X direction or Y direction) may be a weak region WKR (see FIG. 3B). In some embodiments, the weak region WKR may include a portion of the package base substrate 10 that is the second width W2 from either side, horizontally, of the first edge EDW of the first semiconductor chip 100BM. In some embodiments, the first edge EDW may be disposed in an interior portion that is in the middle, horizontally, of the weak region WKR. For example, the second width W2 may have a value equal to or greater than that of the first width W1. In some embodiments, the second width W2 and the first width W1 may have the same value. In some other embodiments, the second width W2 may have a value twice that of the first width W1.

Figure 4A:
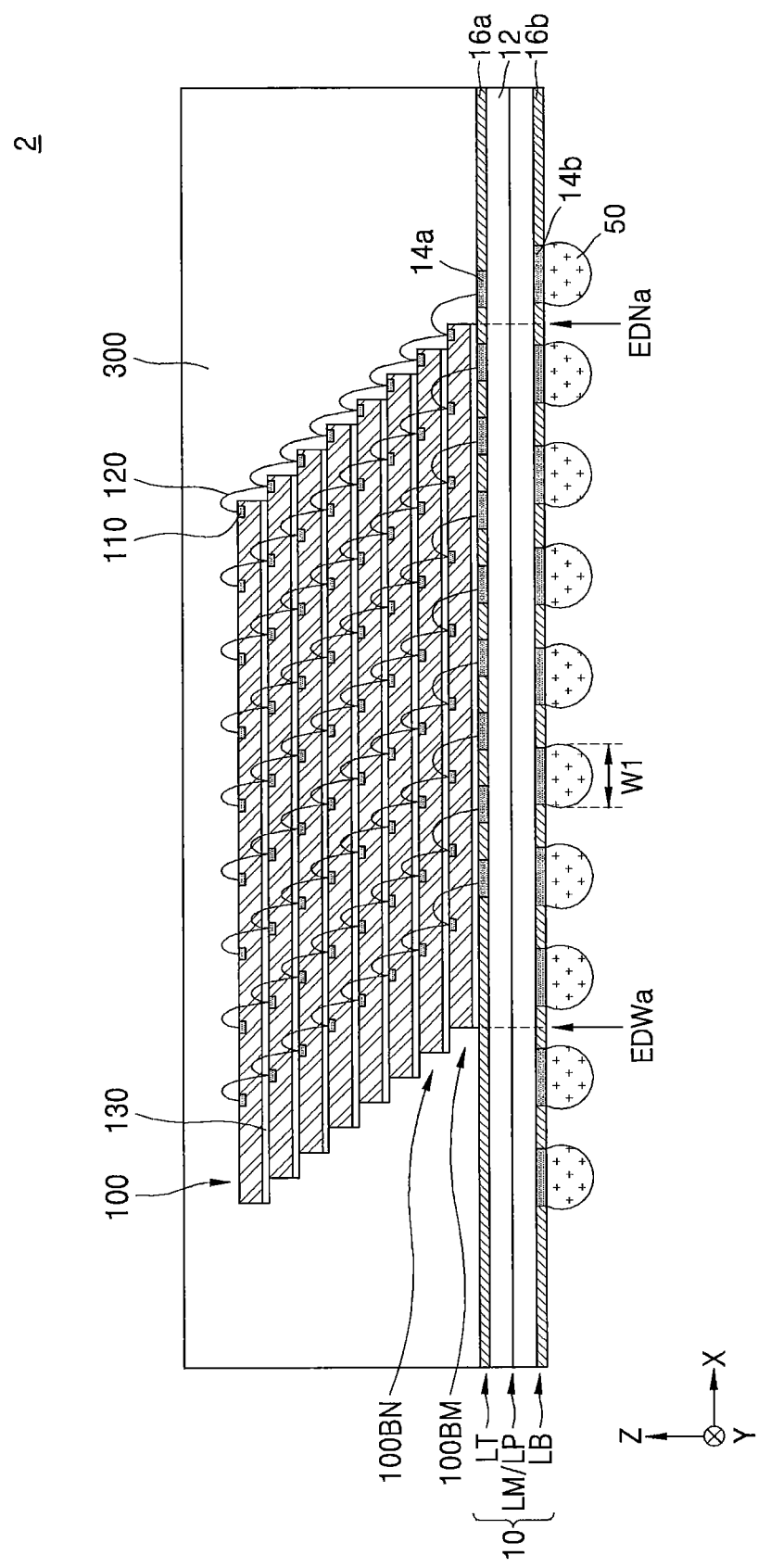
FIG. 4A is a cross-sectional view of a stacked semiconductor package according to an example embodiment of the inventive concepts.
Figure 4B:
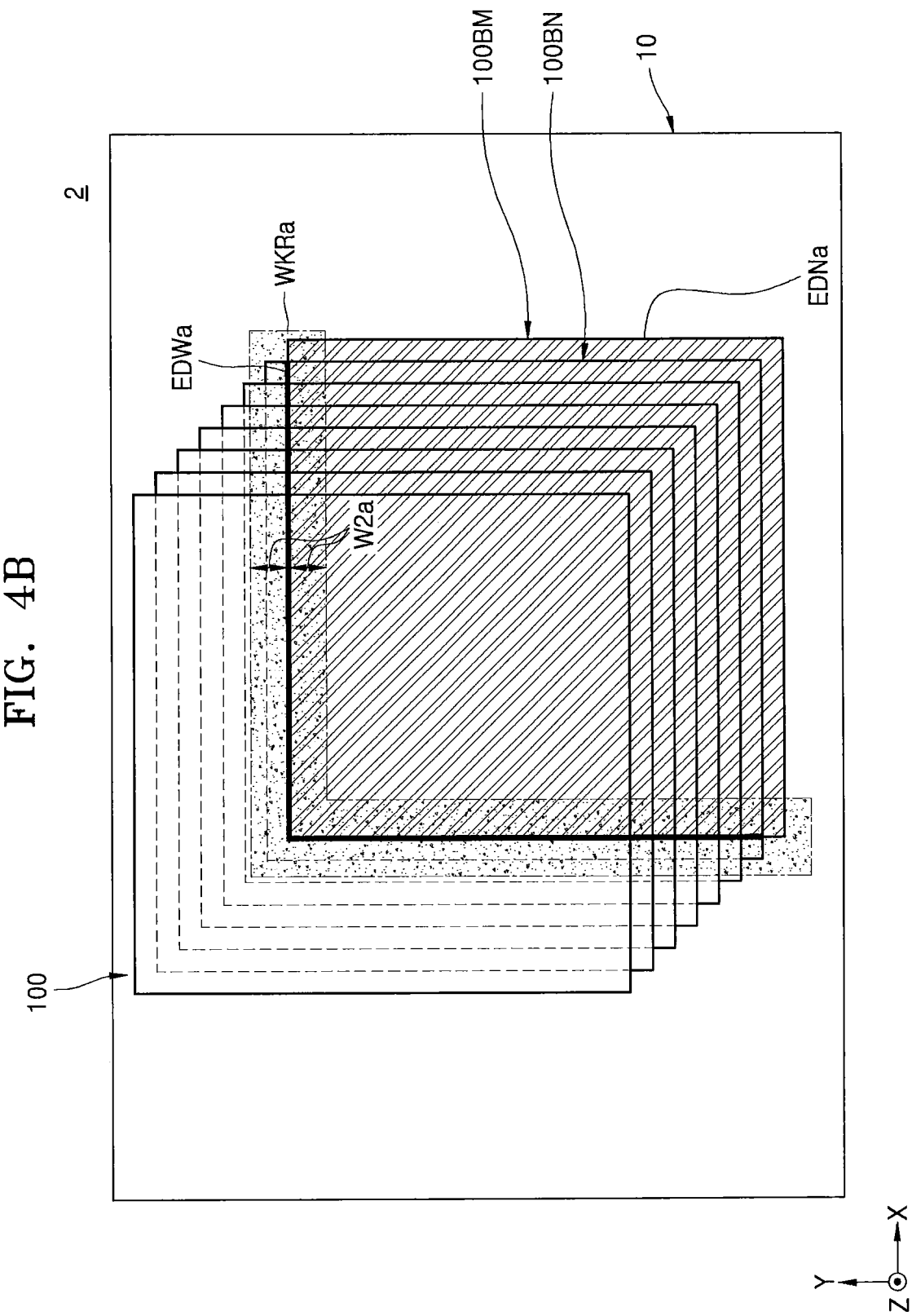
FIG. 4B is a plan view thereof.

FIG. 4A is a cross-sectional view of a stacked semiconductor package 2 according to an example embodiment of the inventive concepts, and FIG. 4B is a plan view thereof. Descriptions of FIGS. 4A and 4B that are identical to those given above with reference to FIGS. 1A to 1C may be omitted.

Referring to FIGS. 4A and 4B, a stacked semiconductor package 2 includes a package base substrate 10 and a plurality of semiconductor chips 100. The semiconductor chips 100 may be sequentially stacked on the package base substrate 10 in the vertical direction (e.g., the Z direction). The semiconductor chips 100 may be stacked in a step-like shape with a substantially constant interval in the horizontal directions (e.g., the X-Y direction). In detail, in the stacked semiconductor package 2, the semiconductor chips 100 may be stacked in a step-like shape in the vertical direction (e.g., Z direction) at substantially constant intervals between edges of the semiconductor chips 100 diagonally in both the −X direction and the −Y direction.

The semiconductor chips 100 include a first semiconductor chip 100BM, which is the bottommost semiconductor chip (e.g., the semiconductor chip 100 that is closest to the package base substrate 10), and a second semiconductor chip 100BN, which is stacked on the first semiconductor chip 100BM. From among the semiconductor chips 100, on the plane (e.g., the X-Y plane), edges of the first semiconductor chip 100BM may include a first edge EDWa and a second edge EDNa. The first edge EDWa refers to an edge of the first semiconductor chip 100BM that overlaps the second semiconductor chip 100BN in the vertical direction (e.g., the Z direction), and the second edge EDNa refers to an edge of the first semiconductor chip 100BM that does not overlap the second semiconductor chip 100BN thereabove in the vertical direction (Z direction). In other words, an edge or an inner portion of the second semiconductor chip 100BN is disposed on the first edge EDWa of the first semiconductor chip 100BM, and an edge or an inner portion of the second semiconductor chip 100BN is not disposed on the second edge EDNa of the first semiconductor chip 100BM.

For example, from among four edges of the first semiconductor chip 100BM, portions of two edges may be first edges EDWa, and the remaining portions of the two edges and the other two entire edges may be second edges EDNa.

A portion of the package base substrate 10 from a portion of the package base substrate 10 overlapping the first edge EDWa in the vertical direction (e.g., the Z direction) to a second width W2a in the horizontal direction (e.g., the X direction or Y directions) may be the weak region WKRa (see FIG. 4A). In some embodiments, the weak region WKRa may include a portion of the package base substrate 10 that is the second width W2a from either side, horizontally, of the first edge EDWa of the first semiconductor chip 100BM. In some embodiments, the first edge EDWa may be disposed in an interior portion that is in the middle, horizontally, of the weak region WKRa. For example, the second width W2a may have a value equal to or greater than that of the first width W1. In some embodiments, the second width W2a and the first width W1 may have the same value. In some other embodiments, the second width W2a may have a value twice that of the first width W1.

Figure 5A:
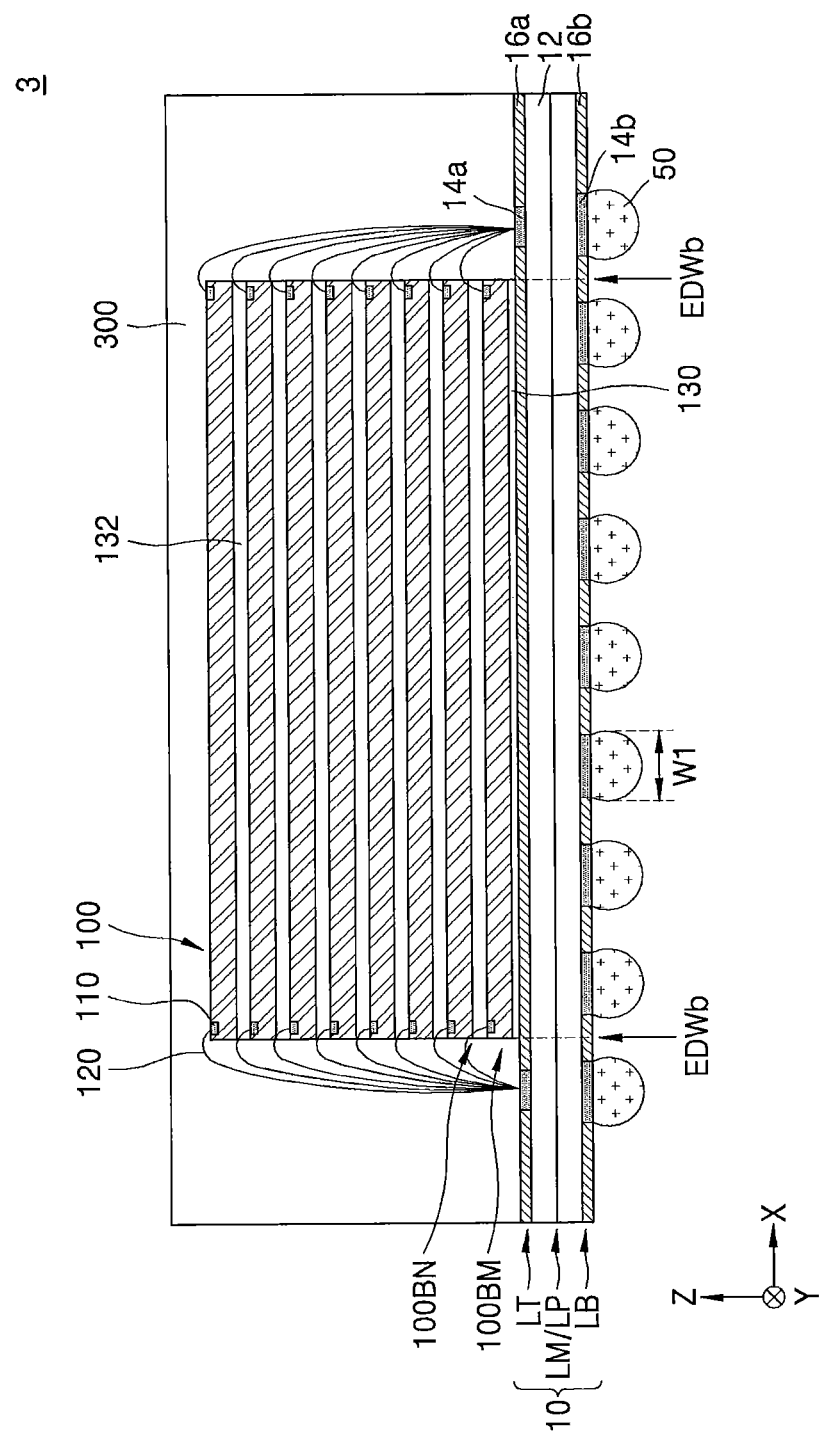
FIGS. 5A and 5B are respective cross-sectional views of stacked semiconductor packages according to example embodiments of the inventive concepts.
Figure 5B:
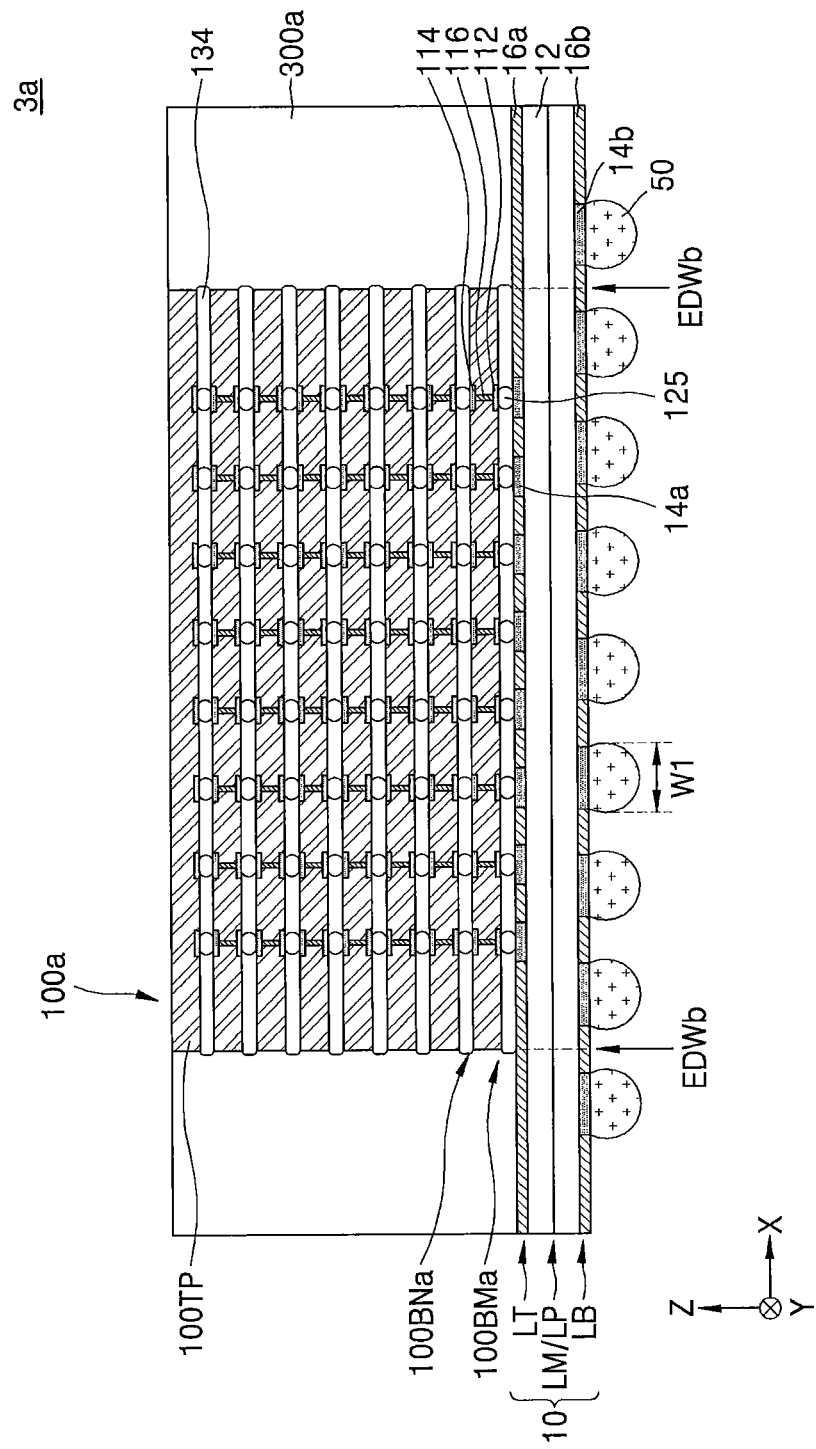
Figure 5C:
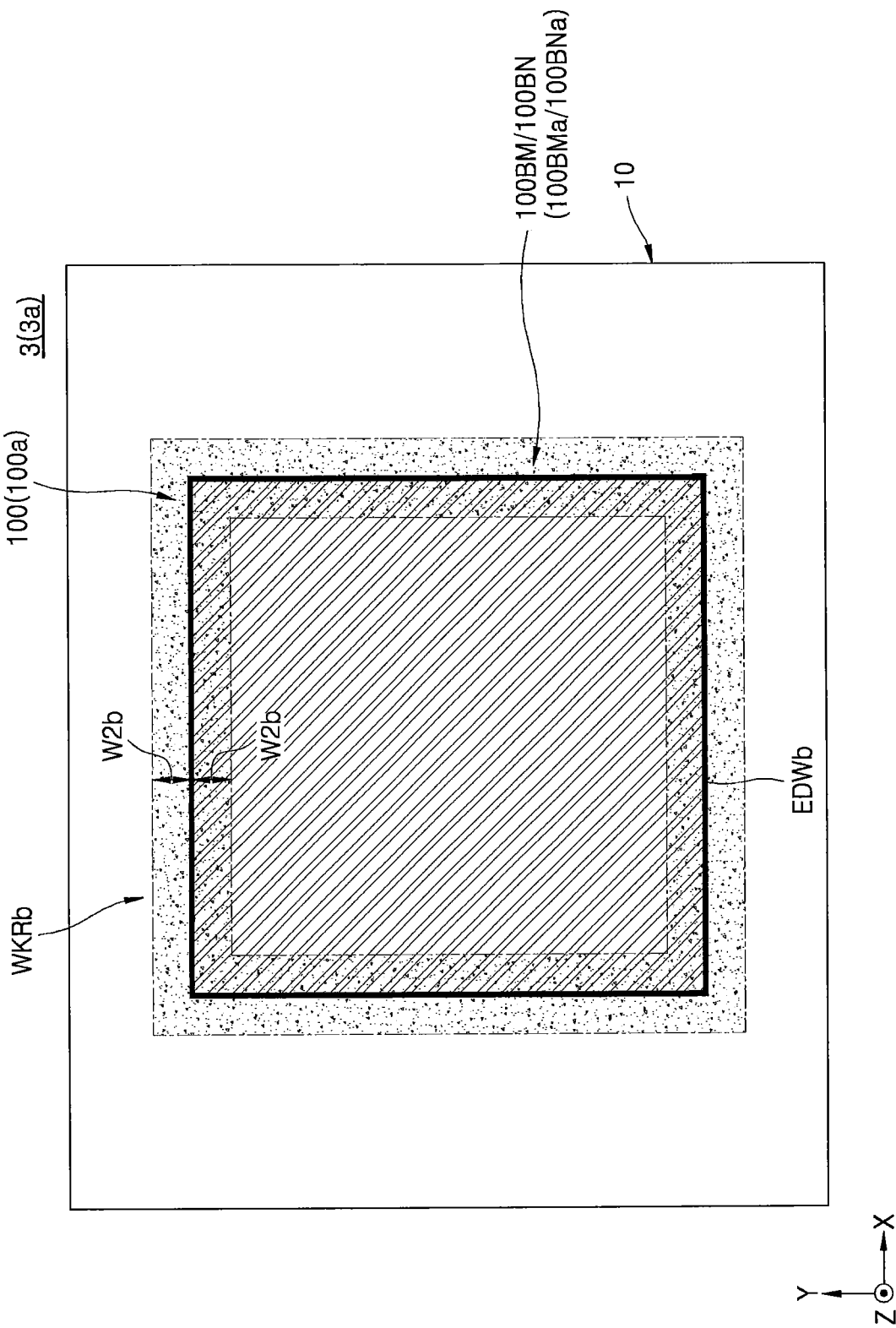
FIG. 5C is a plan view thereof.

FIGS. 5A and 5B are respective cross-sectional views of stacked semiconductor packages 3, 3a according to example embodiments of the inventive concepts, and FIG. 5C is a plan view thereof. Descriptions of FIGS. 5A, 5B, and 5C that are identical to those given above with reference to FIGS. 1A to 1C may be omitted.

Referring to FIG. 5A, a stacked semiconductor package 3 includes the package base substrate 10 and the semiconductor chips 100. The semiconductor chips 100 may be sequentially stacked on the package base substrate 10 in the vertical direction (e.g., the Z direction). The semiconductor chips 100 may be stacked to overlap one another in the vertical direction (e.g., the Z direction).

The semiconductor chips 100 may be attached on a structure therebelow via the thick die adhesive film 132 attached therebetween. For example, the semiconductor chip 100 may attached onto another semiconductor chip 100 therebelow via the thick die adhesive film 132. In some embodiments, the bottommost semiconductor chip 100 from among the semiconductor chips 100 may be attached onto the package base substrate 10 via the die adhesive film 130 therebetween. The thickness of the thick die adhesive film 132 may be greater than the thickness of the die adhesive film 130.

The thick die adhesive film 132 may cover the chip pads 110 of the semiconductor chip 100 therebelow. Portions of the bonding wires 120 connected to the chip pads 110 may be buried in the thick die adhesive film 132.

Referring to FIG. 5B, a stacked semiconductor package 3a includes the package base substrate 10 and a plurality of semiconductor chips 100a. The semiconductor chips 100a may be sequentially stacked on the package base substrate 10 in the vertical direction (e.g., the Z direction). The semiconductor chips 100a may be stacked to overlap one another in the vertical direction (e.g., the Z direction).

Each of the semiconductor chips 100a may include the chip pads 112 disposed on the active surface and a plurality of rear pads 114 disposed on the inactive surface. In some embodiments, the inactive surface may be a side of the semiconductor chip 100a that is an opposite side of the semiconductor chip 100a from the active surface. Each of the semiconductor chips 100a may include a plurality of via electrodes 116 respectively connecting the chip pads 112 and the rear pads 114. In some embodiments, a topmost semiconductor chip 100TP (e.g., a semiconductor chip 100a that is farthest from the package base substrate 10) from among the semiconductor chips 100a may not include the rear pads 114 and the via electrodes 116.

Each of the semiconductor chips 100a may be stacked on the package base substrate 10, such that the active surface faces downward, that is, the direction toward the package base substrate 10. A plurality of chip connection terminals 125 may be attached to the chip pads 112 of each of the semiconductor chips 100a. The chip connection terminals 125 may electrically connect between the chip pads 112 and the top surface connecting pads 14a and between the chip pads 112 and the rear pads 114 of the adjacent semiconductor chip 100a below.

A charging layer 134 surrounding the chip connection terminals 125 may be disposed between the first semiconductor chip 100BMa, which is the bottommost semiconductor chip 100a (e.g., a semiconductor chip 100a that is closest to the package base substrate 10), and the package base substrate 10 and between adjacent ones of the semiconductor chips 100a. The charging layer 134 may include, for example, a die adhesive film (DAF), a non-conductive film (NCF), an anisotropic conductive film (ACF), an instant adhesive, a thermosetting adhesive, a laser curing adhesive, an ultrasonic curing adhesive, a non-conductive paste (NCP), etc., though the inventive concepts are not limited thereto.

In some embodiments, the charging layer 134 may protrude outwardly from the edges of the semiconductor chips 100a (e.g., in an X and/or Y direction). In some embodiments, the charging layer 134 may protrude outward from the edges of the semiconductor chips 100a to cover at least portions of the side surfaces of one or more of the semiconductor chips 100a.

A mold layer 300a covering the top surface of the package base substrate 10 and surrounding the semiconductor chips 100a may be disposed on the package base substrate 10. In some embodiments, the mold layer 300a may be exposed without covering the top surface of the topmost semiconductor chip 100TP. In some embodiments, a heat dissipating member may be attached on the top surface of the topmost semiconductor chip 100TP. A thermal interface material (TIM) may be disposed between the top surface of the topmost semiconductor chip 100TP and the heat dissipating member.

Referring to FIGS. 5A to 5C, the semiconductor chips 100 of the stacked semiconductor packages 3 or the semiconductor chips 100a of the stacked semiconductor package 3a include the first semiconductor chip 100BM or 100BMa, which is the bottommost semiconductor chip 100 or 100a, and the second semiconductor chip 100BN or 100BNa, which is the second bottommost semiconductor chip 100 or 100a stacked on the first semiconductor chip 100BM or 100BMa. Four edges EDWb constituting the edges of the first semiconductor chip 100BM or 100BMa, which is the bottommost semiconductor chip 100a, may completely overlap the second semiconductor chip 100BN or 100BNa in the vertical direction (e.g., Z direction). The edges or inner portion of the second semiconductor chip 100BN or 100BNa may be disposed on the edges EDWb of the first semiconductor chip 100BM or 100BMa. In some embodiments, the edges of the second semiconductor chip 100BN or 100BNa may be substantially coplanar with the edges EDWb of the first semiconductor chip 100BM or 100BMa.

A portion of the package base substrate 10 from a portion of the package base substrate 10 overlapping the four edges EDWb constituting the edges of the first semiconductor chip 100BM or 100BMa in the vertical direction (e.g., the Z direction) to a second width W2b in the horizontal direction (e.g., the X direction or Y direction) may be a weak region WKRb (see FIG. 5C). In some embodiments, the weak region WKRb may include a portion of the package base substrate 10 that is the second width W2b from either side, horizontally, of the four edges EDWb of the first semiconductor chip 100BM or 100BMa. In some embodiments, the four edges EDWb may be disposed in an interior portion that is in the middle, horizontally, of the weak region WKRb. For example, the second width W2b may have a value equal to or greater than that of the first width W1. In some embodiments, the second width W2b and the first width W1 may have the same value. In some other embodiments, the second width W2b may have a value twice that of the first width W1.

Figure 6A:
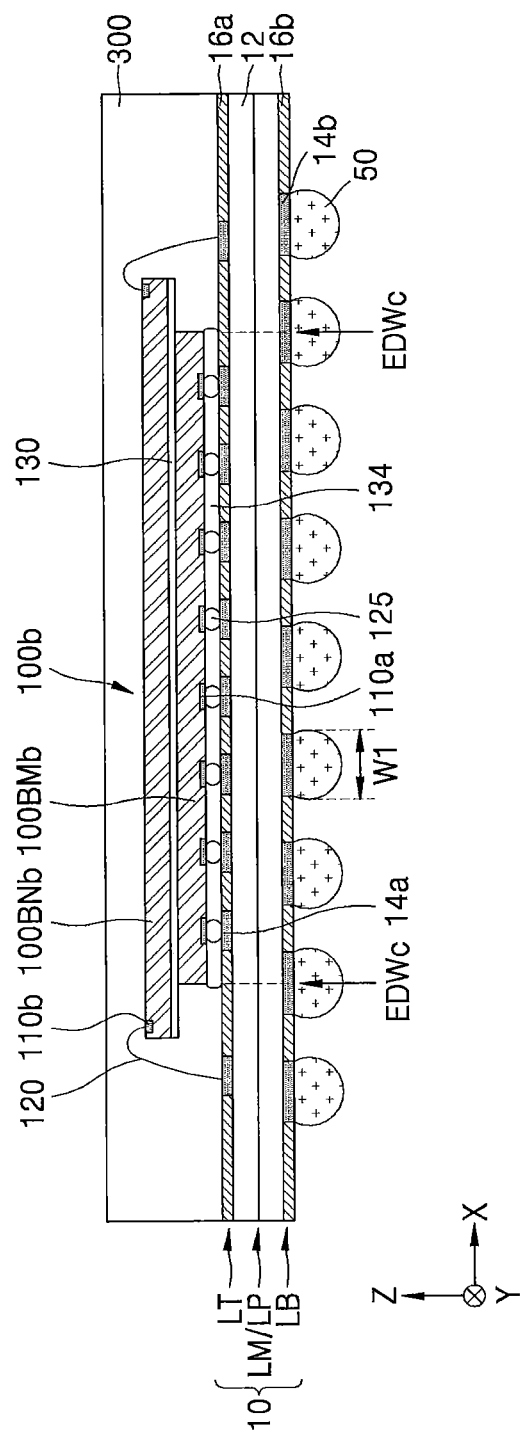
FIG. 6A is a cross-sectional view of a stacked semiconductor package according to an example embodiment of the inventive concepts.
Figure 6B:
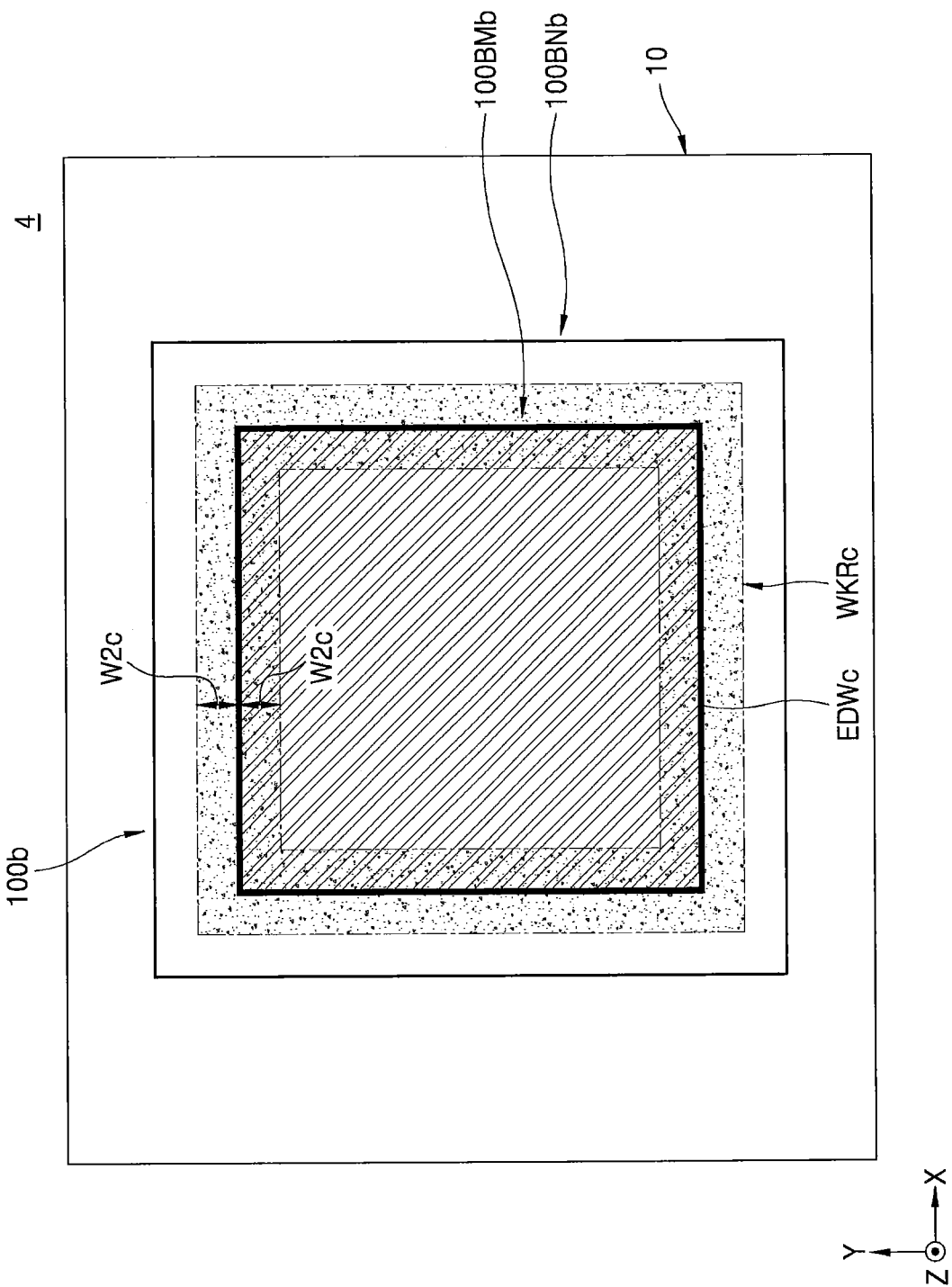
FIG. 6B is a plan view thereof.

FIG. 6A is a cross-sectional view of a stacked semiconductor package 4 according to an example embodiment of the inventive concepts, and FIG. 6B is a plan view thereof. Descriptions of FIGS. 6A and 6B that are identical to those given above with reference to FIGS. 1A to 1C and/or FIGS. 5A to 5C may be omitted.

Referring to FIGS. 6A and 6B, a stacked semiconductor package 4 includes the package base substrate 10 and a plurality of semiconductor chips 100b. The semiconductor chips 100b may be sequentially stacked on the package base substrate 10 in the vertical direction (e.g., the Z direction). The semiconductor chips 100b may include a first semiconductor chip 100BMb and a second semiconductor chip 100BNb, which is stacked on the first semiconductor chip 100BMb. The second semiconductor chip 100BNb may have a larger width in one or more dimensions (e.g., in the X and/or Y direction) than the first semiconductor chip 100BMb. Therefore, the second semiconductor chip 100BNb may completely overlap the first semiconductor chip 100BMb and may extend to the outside of the first semiconductor chip 100BMb to be overhung in the horizontal direction (e.g., the X direction and/or Y direction) with respect to the first semiconductor chip 100BMb. Although FIG. 6A shows that the semiconductor chips 100b include one first semiconductor chip 100BMb and one second semiconductor chip 100BNb, the inventive concepts are not limited thereto, and the semiconductor chips 100b may include a plurality of first semiconductor chips 100BMb stacked to overlap one another in the vertical direction (Z direction) or a plurality of second semiconductor chips 100BNb that are stacked on the first semiconductor chip 100BMb to overlap one another or in a step-like shape.

In some embodiments, the first semiconductor chip 100BMb may be, for example, a central processor unit (CPU), a micro processor unit (MPU), a graphic processor unit (GPU), or an application processor (AP), and the second semiconductor chip 100BNb may be a semiconductor memory chip such as, for example, a non-volatile semiconductor memory chip or a volatile semiconductor memory chip.

In some embodiments, the first semiconductor chip 100BMb may be a volatile semiconductor memory chip, and the second semiconductor chip 100BNb may be a non-volatile semiconductor memory chip.

The first semiconductor chip 100BMb may be stacked on the package base substrate 10, such that the active surface faces downward, that is, the direction toward the package base substrate 10. The chip connection terminals 125 may be attached to a plurality of first chip pads 110a disposed on the active surface of the first semiconductor chip 100BMb. The chip connection terminals 125 may electrically connect the first chip pads 110a and the top surface connecting pads 14a.

The charging layer 134 surrounding the chip connection terminals 125 may be disposed between the first semiconductor chip 100BMb and the package base substrate 10.

The second semiconductor chip 100BNb may be stacked on the first semiconductor chip 100BMb, such that the active surface faces upward, that is, the opposite direction to the package base substrate 10. The second semiconductor chip 100BNb may be attached onto the first semiconductor chip 100BMb via the die adhesive film 130 attached therebetween.

The bonding wires 120 may electrically connect a plurality of second chip pads 110b disposed on the active surface of the second semiconductor chip 100BNb and the top surface connecting pads 14a.

Four edges EDWc constituting the edges of the first semiconductor chip 100BMb of the stacked semiconductor package 4 may completely overlap the second semiconductor chip 100BNb in the vertical direction (e.g., the Z direction). The entire the inner portion of the second semiconductor chip 100BNb may be disposed on the edges EDWc of the first semiconductor chip 100BMb.

A portion the package base substrate 10 from a portion of the package base substrate 10 overlapping the four edges EDWc constituting the edges of the first semiconductor chip 100BMb in the vertical direction (e.g., the Z direction) to a second width W2c in the horizontal direction (e.g., the X direction or Y direction) may be a weak region WKRc (see FIG. 6B). In some embodiments, the weak region WKRc may include a portion of the package base substrate 10 that is the second width W2c from either side, horizontally, of the four edges EDWc of the first semiconductor chip 100BMb. In some embodiments, the four edges EDWc may be disposed in an interior portion that is in the middle, horizontally, of the weak region WKRc. For example, the second width W2c may have a value equal to or greater than that of the first width W1. In some embodiments, the second width W2c and the first width W1 may have the same value. In some other embodiments, the second width W2c may have a value twice that of the first width W1.

Figure 7A:
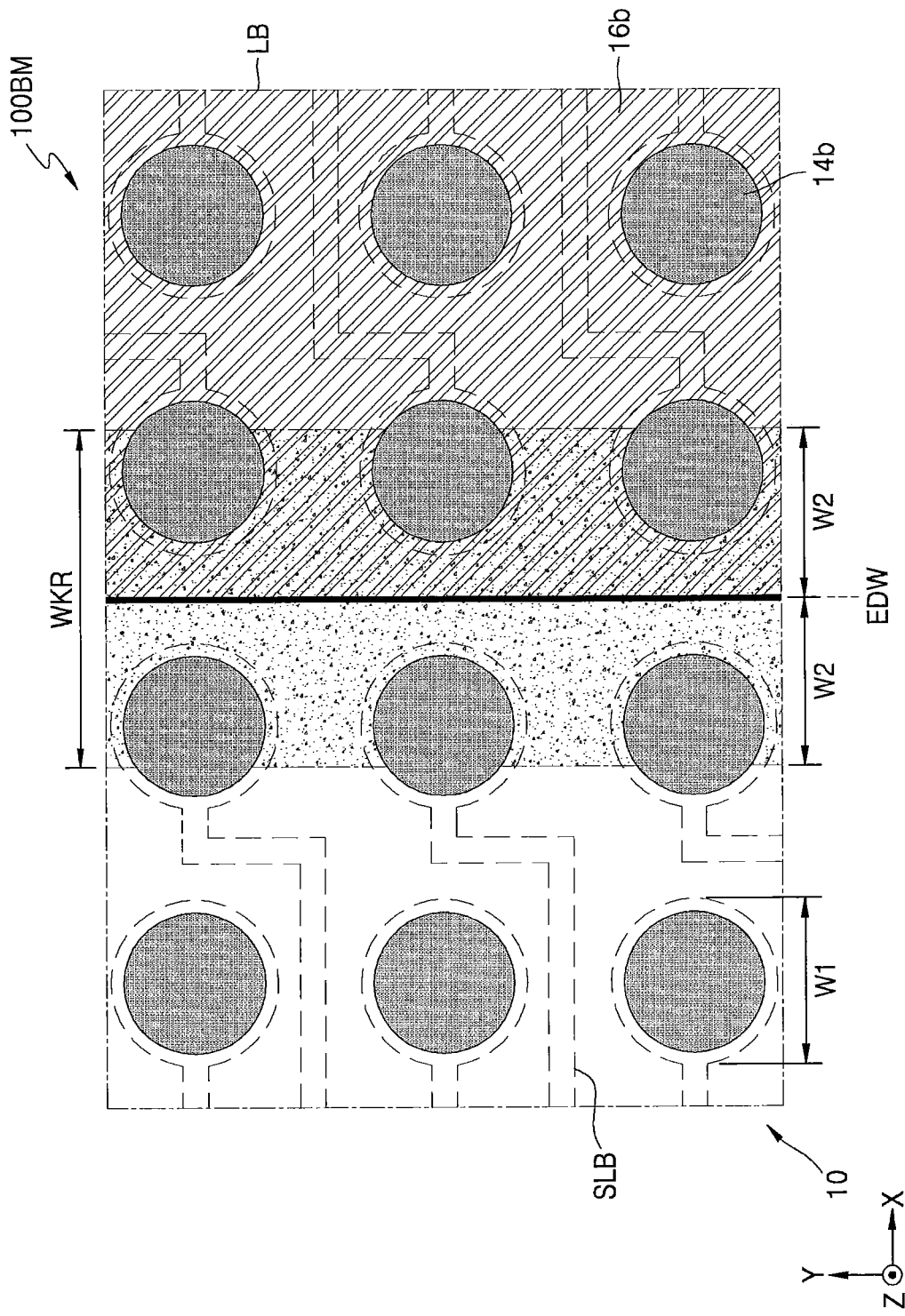
FIGS. 7A to 7C are plan views of a bottom layer of a package base substrate of a stacked semiconductor package according to an example embodiment of the inventive concepts.
Figure 7B:
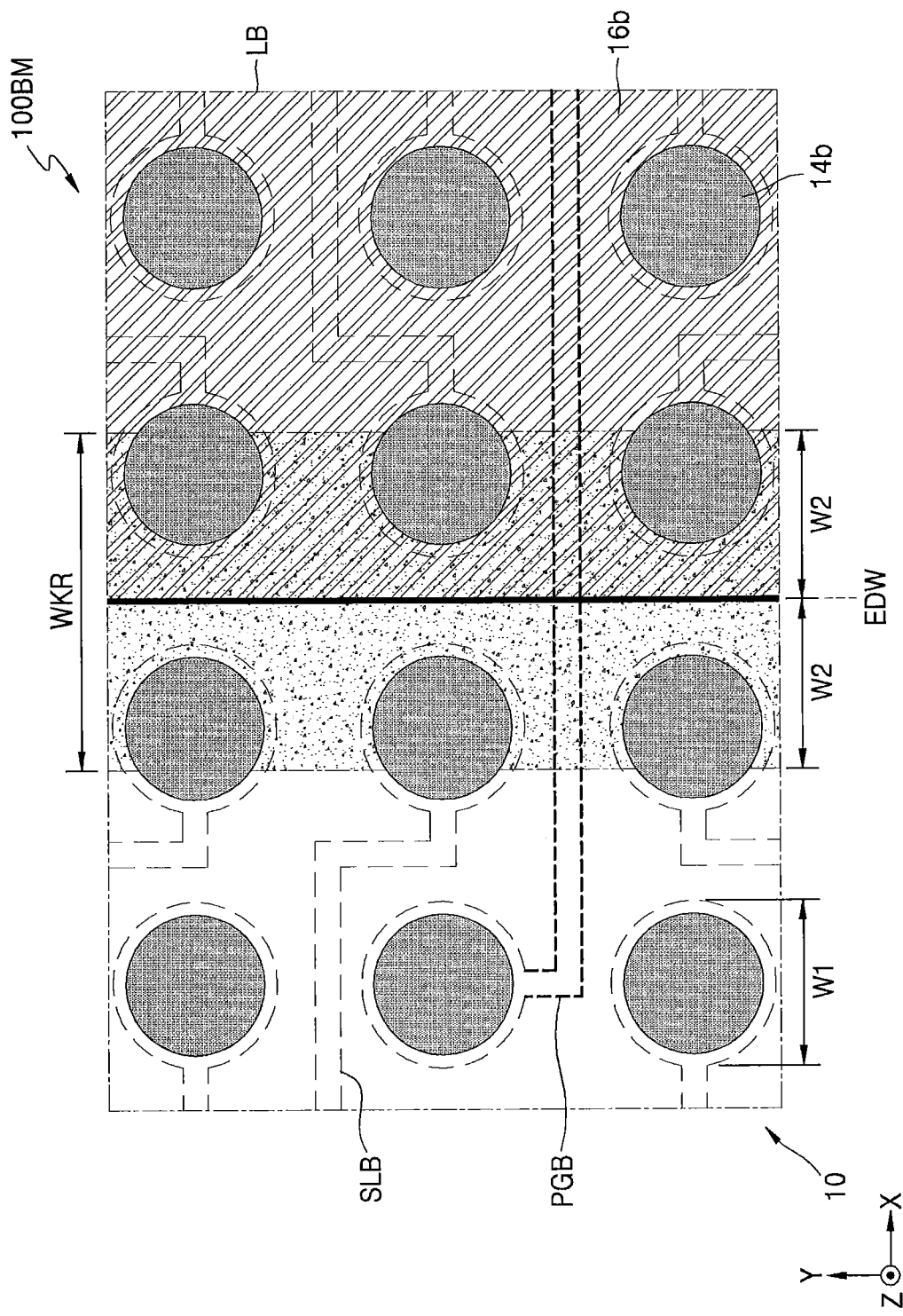
Figure 7C:
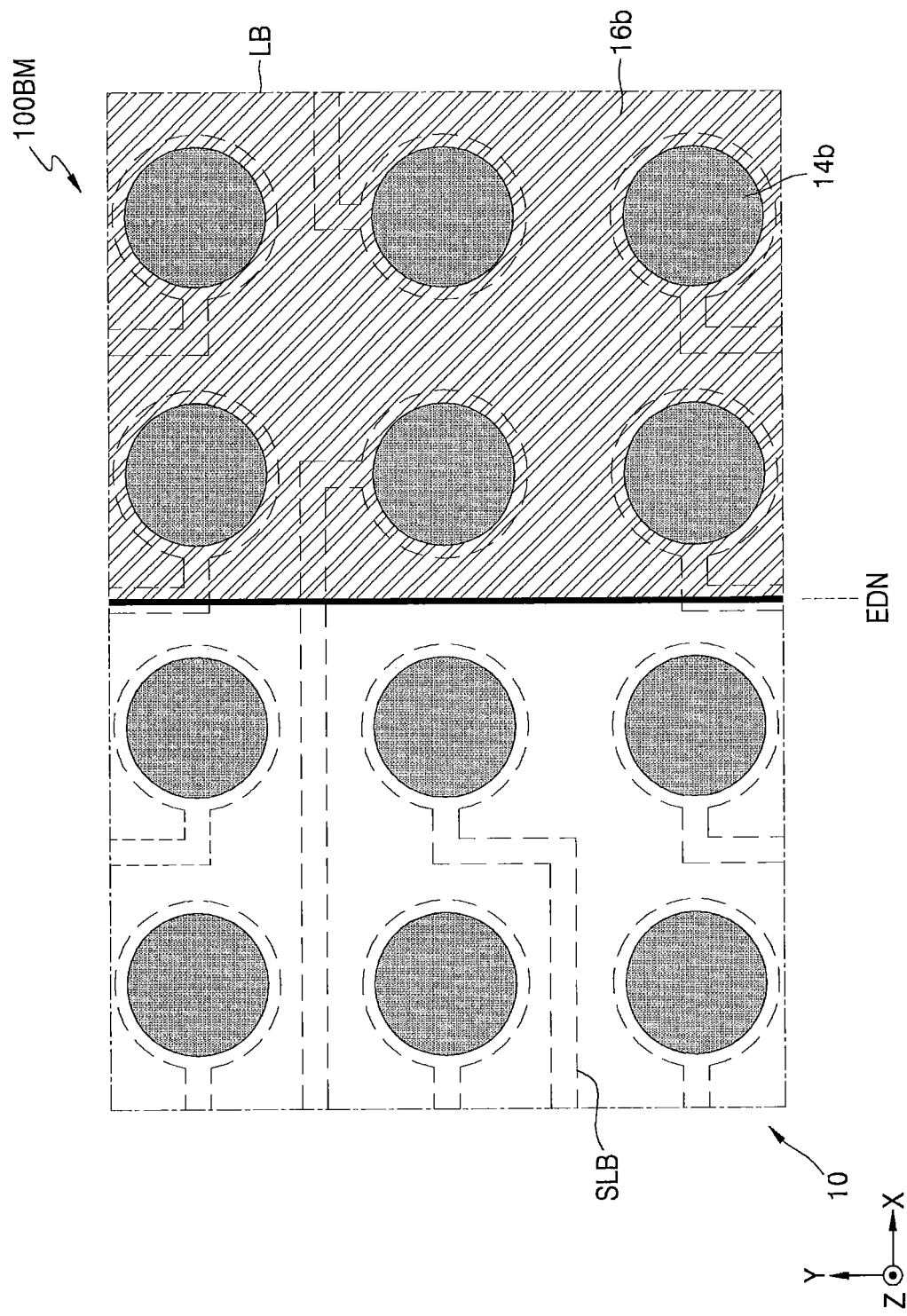

FIGS. 7A to 7C are plan views of a bottom layer of a package base substrate 10 of a stacked semiconductor package according to an example embodiment of the inventive concepts. FIGS. 7A to 7C show plan view layouts of the bottom layer LB of the package base substrate 10 based on the first semiconductor chip 100BM of the semiconductor package 1, the semiconductor package 1a, the semiconductor package 1b, and the semiconductor package 1c shown in FIGS. 1A to 3B. However, plan view layouts shown in FIGS. 7A to 7C may be applied to the plan layout of the bottom layer LB of the package base substrate 10 based on the first semiconductor chips 100BMa and 100BMb of the semiconductor packages 2, 3, 3a, and 4 shown in FIGS. 4A to 6B. In some embodiments, the first edge EDW may correspond to the first edge EDWa or the edge EDWb or EDWc, the second edge EDN may correspond to the second edge EDNa, and the second width W2 may correspond to the second width W2a, W2b, or W2c. In other words, though FIGS. 7A to 7C illustrate embodiments oriented with respect to the embodiments of FIGS. 1A to 3B, it will be understood that the concepts discussed with respect to FIGS. 7A to 7C may be applied, mutatis mutandis, with respect to embodiments of FIGS. 4A to 6B without deviating from the inventive concepts described herein.

Referring to FIG. 7A, the package base substrate 10 may have the bottom layer LB. The bottom surface connecting pads 14b may be disposed in the bottom layer LB. Each of the plurality of bottom surface connecting pads 14b may have a first width W1. In some embodiments, portions of the bottom surface connecting pads 14b adjacent to the edges of the bottom surface connecting pads 14b may be covered by the solder resist layer 16b, and the remaining portions may be exposed without being covered. In some other embodiments, the bottom surface solder resist layer 16b may be omitted.

The package base substrate 10 may have the weak region WKR from a portion overlapping the first edge EDW to the second width W2. In the package base substrate 10, the portion overlapping the first edge EDW may be referred to as the center of the weak region WKR. For example, the second width W2 may have a value equal to or greater than that of the first width W1. In some embodiments, the second width W2 and the first width W1 may have the same value. In some other embodiments, the second width W2 may have a value twice that of the first width W1.

The bottom layer LB may be provided with a plurality of signal wires SLB connected to at least some of the bottom surface connecting pads 14b. In the bottom layer LB, the signal wires SLB may not be disposed in the weak region WKR, but may be disposed apart and/or remote from (e.g., outside) the weak region WKR. The signal wire SLB connected to the bottom surface connecting pad 14b that is at least partially disposed over and/or within the weak region WKR may be connected to an edge of the bottom surface connecting pad 14b that is located far from the center of the weak region WKR. In some embodiments, signal wire SLB connected to the bottom surface connecting pad 14b that is at least partially disposed over and/or within the weak region WKR may be connected to an edge of the bottom surface connecting pad 14b that is not over and/or within the weak region WKR.

In the bottom layer LB, the signal wire SLB connected to the bottom surface connecting pad 14b may be referred to as a connecting signal wire.

Stress caused by the first semiconductor chip (e.g., semiconductor chip 100BM of FIGS. 1A to 3B) and the second semiconductor chip (e.g., semiconductor chip 100BN of FIGS. 1A to 3B) may be concentrated on a portion of the package base substrate 10 overlapping the first edge EDW, that is, a portion of the package base substrate 10 below a portion of the package base substrate 10 overlapping an edge of the first semiconductor chip 100BM that overlaps the second semiconductor chip 100BN in the vertical direction (e.g., the Z direction) and portions of the package base substrate 10 adjacent thereto, and thus edges of the bottom surface connecting pad 14b disposed in the weak region WKR or edges of the bottom surface connecting pad 14b exposed by the bottom surface solder resist layer 16b may be damaged by the stress.

If the signal wire SLB is disposed in the weak region WKR, damage to the bottom surface connecting pad 14b may be propagated to the portion of the signal wire SLB in the weak region WKR, and thus the signal wire SLB may also be damaged. However, since the signal wire SLB of the package base substrate 10 is disposed apart and/or remote from (e.g., outside) the weak region WKR, damage to the signal wire SLB may be prevented and/or reduced.

Stress applied to a portion of the bottom surface connecting pad 14b, which is at least partially disposed in the weak region WKR, may also be transmitted to a portion of the bottom surface connecting pad 14b disposed outside the weak region WKR. However, since the signal wire SLB connected to the bottom surface connecting pad 14b is connected to an edge of the bottom surface connecting pad 14b far from the center of the weak region WKR, the signal wire SLB may be prevented and/or reduced from being damaged by the stress.

Referring to FIG. 7B, the package base substrate 10 may be provided with a power wire PGB in the bottom layer LB. The signal wires SLB may be respectively connected to ones of the bottom surface connecting pads 14b, and the power wire PGB may be connected to other ones of the bottom surface connecting pads 14b.

In the bottom layer LB, the signal wire SLB may not be disposed in the weak region WKR, but may be disposed apart and/or remote from (e.g., outside) the weak region WKR. The power wire PGB may be at least partially disposed in the weak region WKR in the bottom layer LB. For example, the power wire PGB may be disposed within the weak region WKR and outside the weak region WKR. In some embodiments, the power wire PGB may be arranged to pass through the weak region WKR.

Although not shown in FIG. 7B, a plurality of power wires PGB may be provided, and at least some of the power wires PGB may not be disposed in the weak region WKR and may be disposed apart from the weak region WKR, similar to the signal wire SLB.

In the bottom layer LB, the power wire PGB connected to the bottom surface connecting pads 14b may be referred to as a connecting power wire.

Referring to FIG. 7C, a portion of the signal wire SLB may be disposed in the bottom layer LB at a portion of the package base substrate 10 overlapping the second edge EDN. The signal wire SLB may extend from the lower portion of the first semiconductor chip 100BM to outside the lower portion of the first semiconductor chip 100BM through a portion of the package base substrate 10 overlapping the second edge EDN.

Since relatively less stress is concentrated on a portion of the package base substrate 10 overlapping the second edge EDN, that is, a portion of the package base substrate 10 below a portion of the package base substrate 10 below an edge of a first semiconductor chip (e.g., 100BM in FIGS. 1A to 3B) that does not overlap the second semiconductor chip (e.g., 100BN in FIGS. 1A to 3B) in the vertical direction (e.g., the Z direction), the signal wire SBL may not be damaged.

Figure 8A:
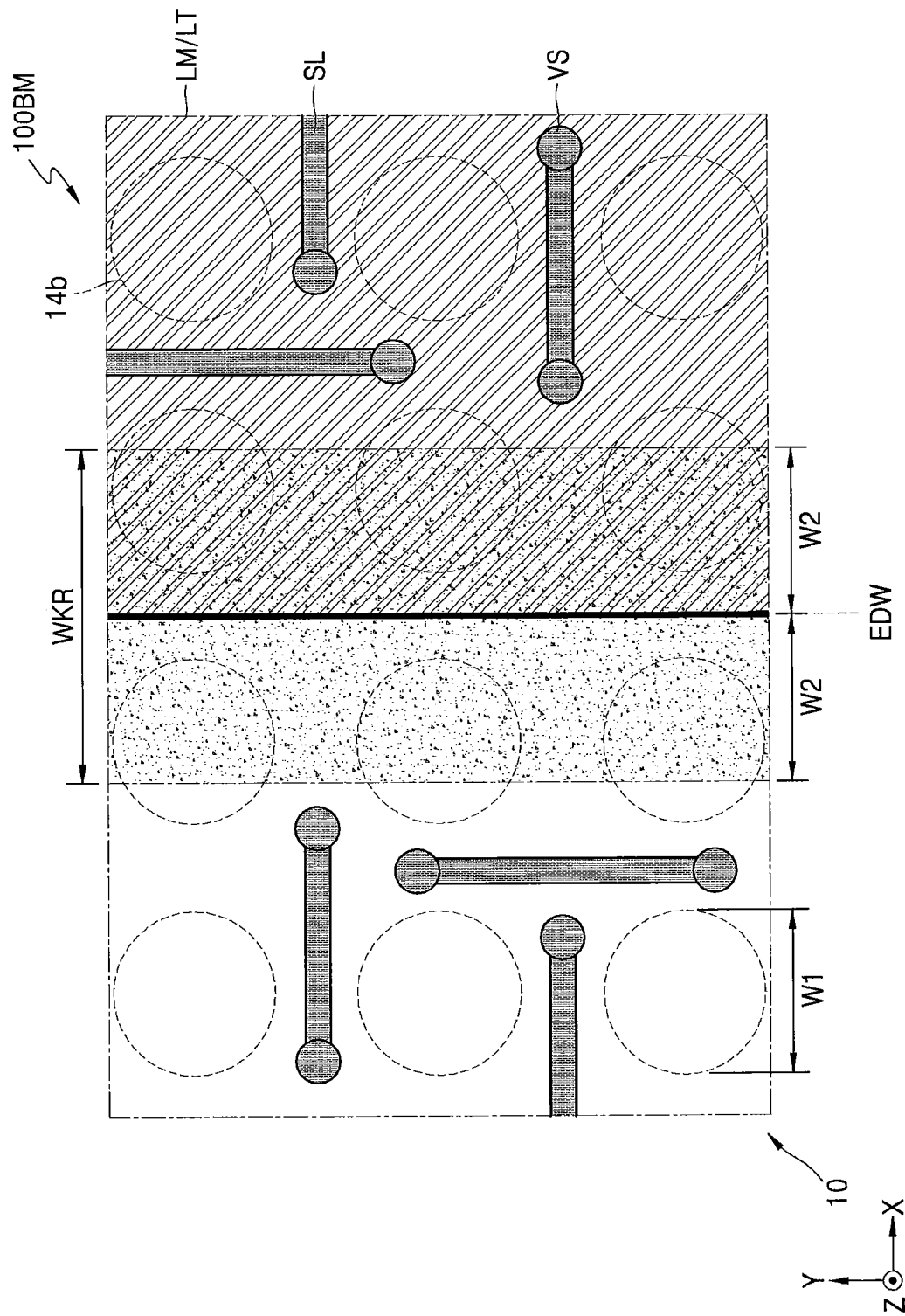
FIGS. 8A, 8B, and 8C are plan views of a middle layer or a top layer of a package base substrate of a stacked semiconductor package according to an example embodiment of the inventive concepts.
Figure 8B:
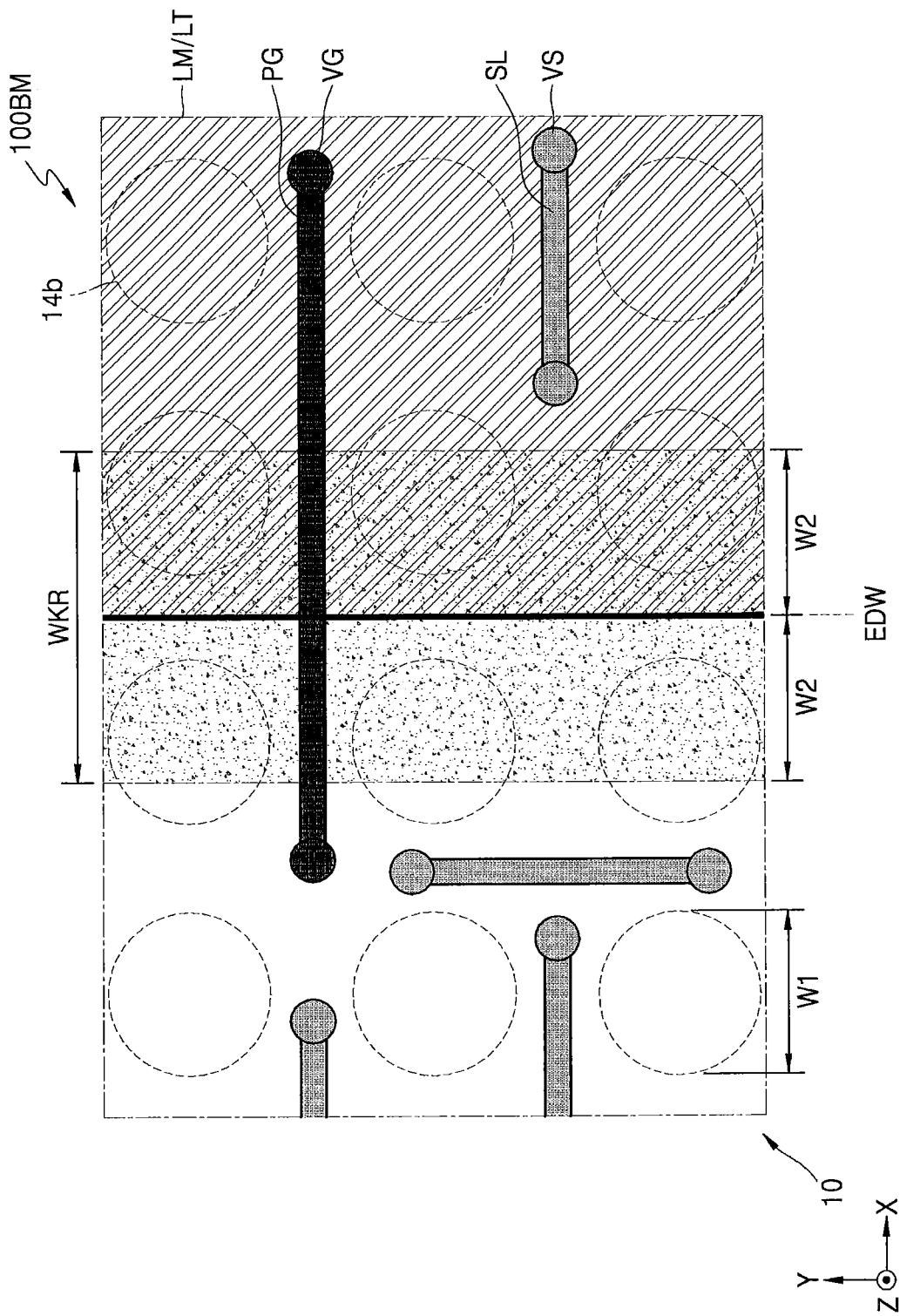
Figure 8C:
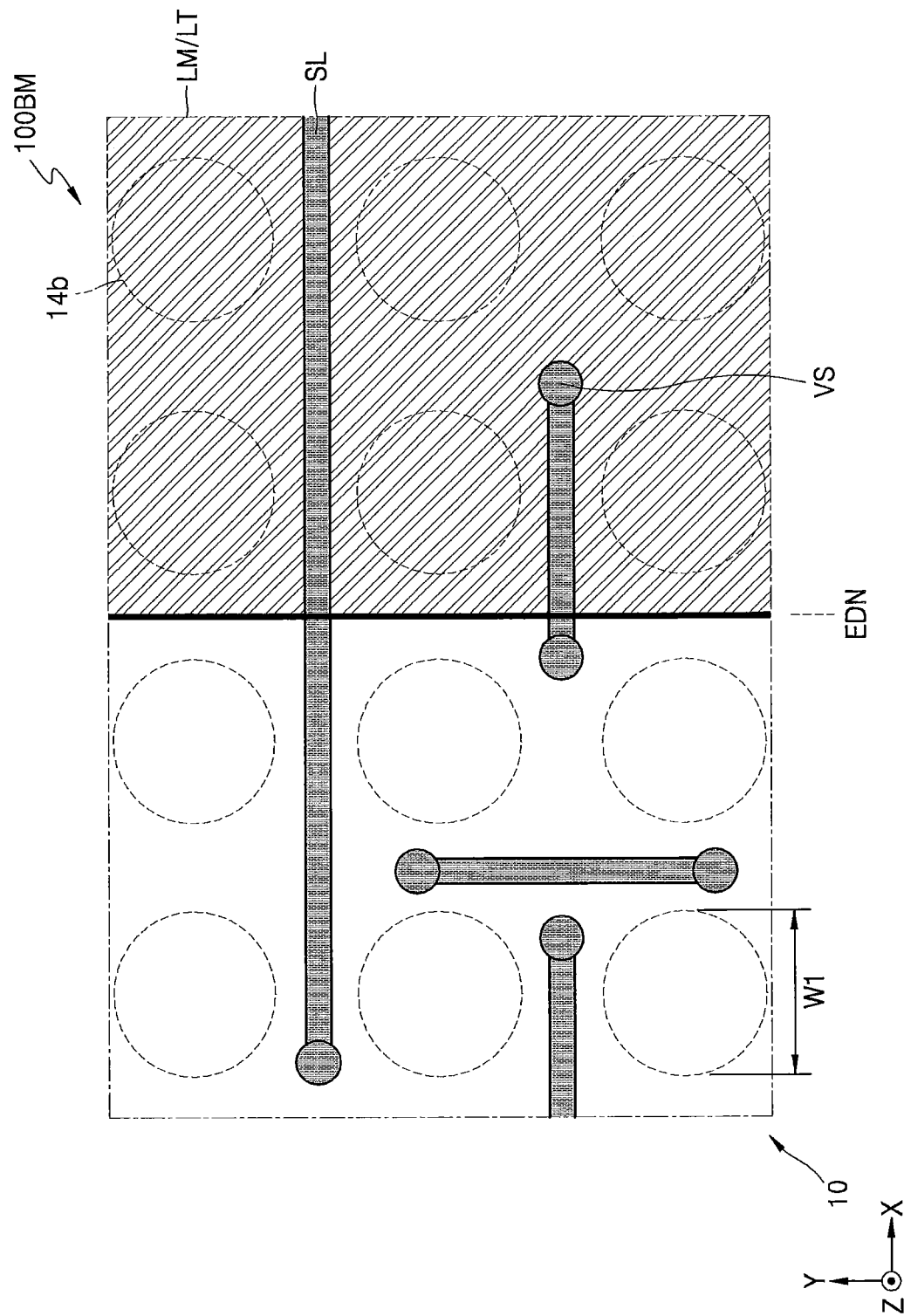

FIGS. 8A, 8B, and 8C are plan views of a middle layer or a top layer of a package base substrate 10 of a stacked semiconductor package according to an example embodiment of the inventive concepts. FIGS. 8A to 8C show plan view layouts of the bottom layer LB of the package base substrate 10 based on the first semiconductor chip 100BM of the semiconductor package 1, the semiconductor package 1a, the semiconductor package 1b, and the semiconductor package 1c shown in FIGS. 1A to 3B. However, plan layouts shown in FIGS. 8A to 8C may be applied to the plan layout of the middle layer LM or the top layer LT of the package base substrate 10 based on the first semiconductor chips 100BMa and 100BMb of the semiconductor packages 2, 3, 3a, and 4 shown in FIGS. 4A to 6B. In some embodiments, the first edge EDW may correspond to the first edge EDWa or the edge EDWb or EDWc, the second edge EDN may correspond to the second edge EDNa, and the second width W2 may correspond to the second width W2a, W2b, or W2c. In other words, though FIGS. 8A to 8C illustrate embodiments oriented with respect to the embodiments of FIGS. 1A to 3B, it will be understood that the concepts discussed with respect to FIGS. 8A to 8C may be applied, mutatis mutandis, with respect to embodiments of FIGS. 4A to 6B without deviating from the inventive concepts described herein.

Referring to FIG. 8A, the package base substrate 10 may have the top layer LT or the top layer LT and the middle layer LM. The package base substrate 10 may have the weak region WKR from a portion overlapping the first edge EDW to the second width W2. In the package base substrate 10, the portion overlapping the first edge EDW may be referred to as the center of the weak region WKR.

A signal wire SL may be arranged in the top layer L) or in the top layer LT and the middle layer LM. In the top layer LT or in the top layer LT and middle layer LM, the signal wire SL may not be disposed in the weak region WKR, but may be disposed apart and/or remote from (e.g., outside) the weak region WKR. At both ends of the signal wire SL, signal vias VS may be disposed for electrical connection with other layers.

Stress caused by the first semiconductor chip (e.g., 100BM of FIGS. 1A to 3B) and the second semiconductor chip (e.g., 100BN of FIGS. 1A to 3B) may be concentrated on a portion of the package base substrate 10 overlapping the first edge EDW, that is, a portion of the package base substrate 10 below a portion of the package base substrate 10 overlapping an edge of the first semiconductor chip 100BM that overlaps the second semiconductor chip 100BN in the vertical direction (e.g., the Z direction) and portions of the package base substrate 10 adjacent thereto, and thus the weak region WKR may be damaged by the stress. Since the signal wire SL is disposed apart and/or remote from (e.g., outside) the weak region WKR, the signal wire SL may be prevented and/or reduced from being damaged by stress.

Referring to FIG. 8B, in the package base substrate 10, a power wire PG may be disposed in the top layer LT or in the top layer LT and the middle layer LM. At both ends of the power wire PG, power vias VG may be disposed for electrical connection with other layers.

In the top layer LT or in the top layer LT and middle layer LM, the signal wire SL may not be disposed in the weak region WKR, but may be disposed apart and/or remote from (e.g., outside) the weak region WKR. At least a portion of the power wire PG may be disposed in the weak region WKR in the top layer LT or in the top layer LT and the middle layer LM. For example, the power wire PG may be disposed within the weak region WKR and outside the weak region WKR.

Although not shown in FIG. 8B, a plurality of power wires PG may be provided, and at least some of the power wires PG may not be disposed in the weak region WKR and may be disposed apart and/or remote from (e.g., outside) the weak region WKR, similar to the signal wire SL.

Referring to FIG. 8C, a portion of the signal wire SL may be disposed in the top layer LT or in the top layer LT and the middle layer LM at a portion of the package base substrate 10 overlapping the second edge EDN. The signal wire SL may extend from the lower portion of the first semiconductor chip 100BM to outside the lower portion of the first semiconductor chip 100BM through a portion of the package base substrate 10 overlapping the second edge EDN.

Figure 9A:
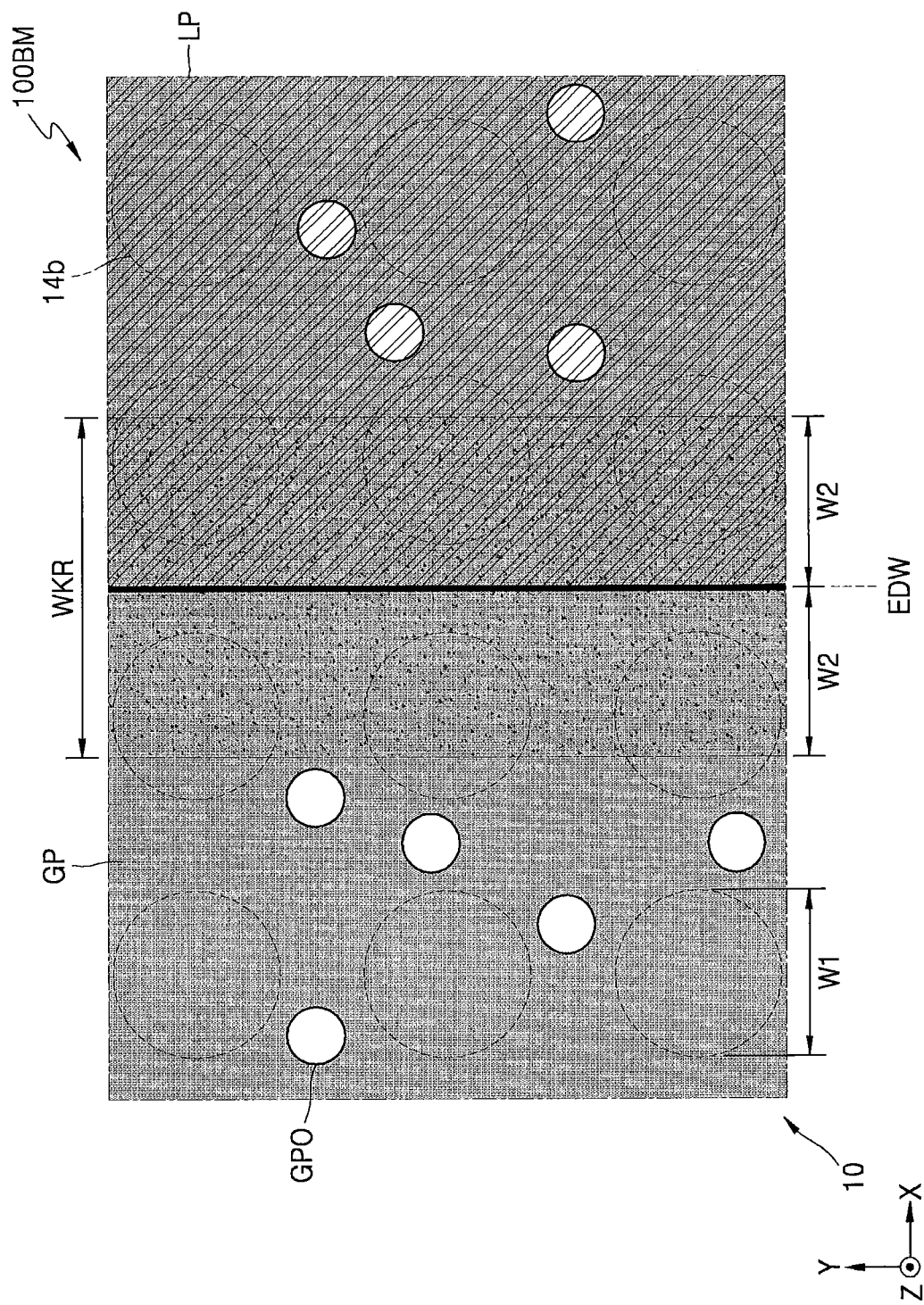
FIG. 9A is a plan view of a plain layer of a package base substrate of a stacked semiconductor package according to an example embodiment of the inventive concepts.
Figure 9B:
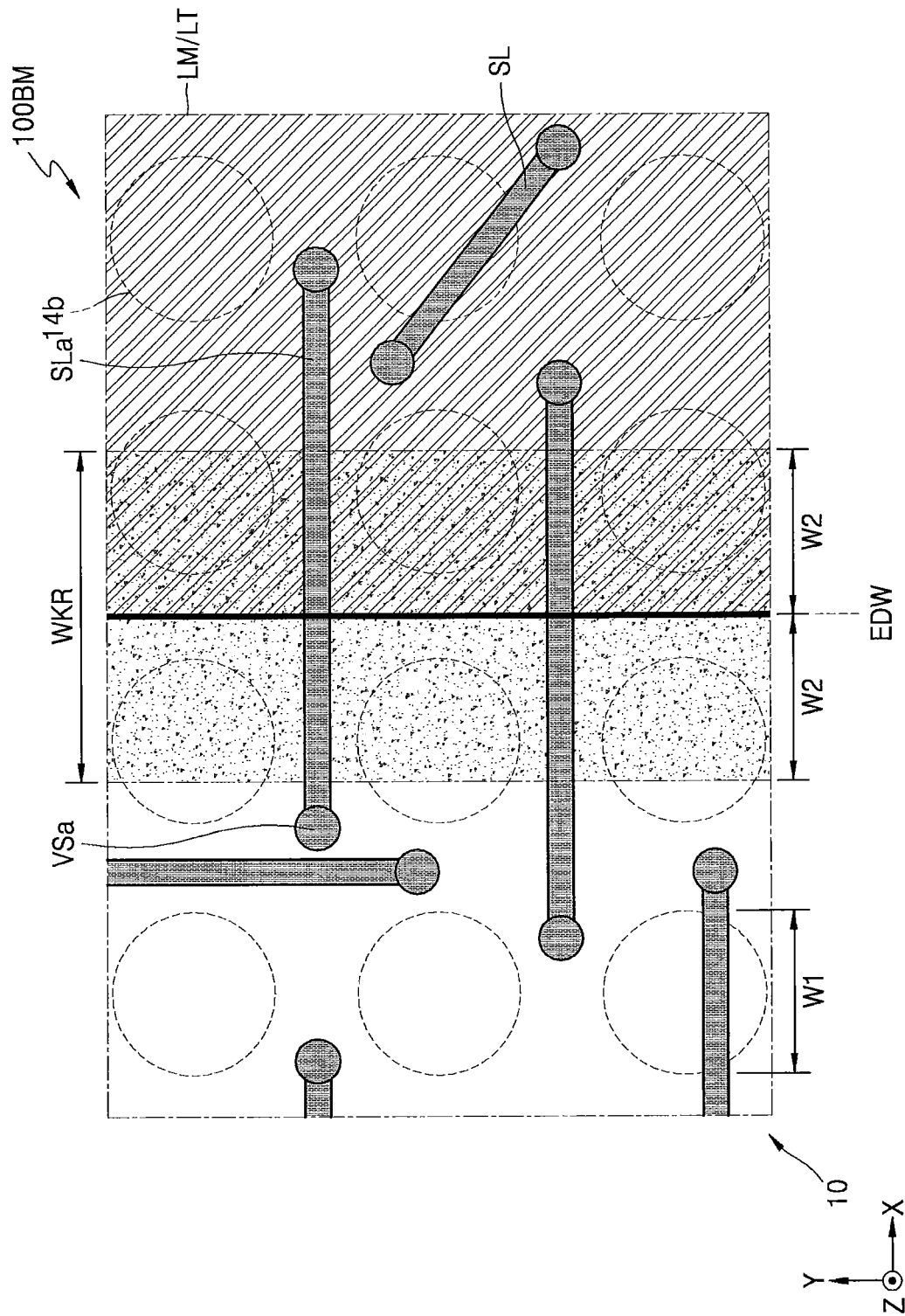
FIG. 9B is a plan view of a middle layer or a top layer of the package base substrate.

FIG. 9A is a plan view of a plain layer of a package base substrate 10 of a stacked semiconductor package according to an example embodiment of the inventive concepts, and FIG. 9B is a plan view of a middle layer or a top layer of the package base substrate 10.

Referring to FIG. 9A, the package base substrate 10 further includes a plain layer LP. In some embodiments, the plain layer LP may be disposed between a bottom layer (LB in FIG. 1A) and a top layer (LT in FIG. 1A). In some embodiments, the plain layer LP may be disposed between the bottom layer LB and a middle layer (LM in FIG. 1A). In some embodiments, the plain layer LP may be disposed between the middle layer LM and the top layer LT.

A ground plane GP may be disposed in the plain layer LP. The ground plane GP may have a generally planar shape throughout the plain layer LP. The ground plane GP may be on and, in some embodiments, cover all or most of the weak region WKR. The ground plane GP may have an opening GPO in which the signal vias VS and the power vias VG shown in FIGS. 8A and 8B may be arranged. The signal vias VS and the power vias VG arranged in the opening GPO may be separated from the ground plane GP.

The ground plane GP may be provided with a ground signal for operation of a plurality of semiconductor chips (e.g., semiconductor chips 100 in FIGS. 1A to 1C).

Although not shown, the package base substrate 10 may further include a separate plain layer LP in which a power plane is provided for powering the semiconductor chips (e.g., semiconductor chips 100 of FIGS. 1A to 1C), and the plain layer LP in which the power plane is disposed may have substantially the same shape as the plain layer LP in which the ground plane GP is disposed. Therefore, a detailed description thereof will be omitted.

Referring to FIG. 9B, the package base substrate 10 may include the middle layer LM or the middle layer LM and the top layer LT. In the package base substrate 10, the plain layer LP as shown in FIG. 9A may be disposed below the middle layer LM or the top layer LT. In other words, the plain layer LP as shown in FIG. 9A may be disposed between the middle layer LM or the top layer LT and the bottom layer LB as shown in FIG. 9B.

The middle layer LM or top layer LT may have signal wires SL and signal wires SLa. Some of the signal wires SL or SLa of the middle layer LM or the top layer LT may be across signal wires SLa that are at least partially arranged in the weak region WKR. In some embodiments, signal vias VSa may be disposed at both ends of the signal wire SLa for electrical connection with other layers.

When the plain layer LP is disposed between the middle layer LM or the top layer LT and the bottom layer LB, the plain layer LP has the ground plane GP covering all or most of the weak region WKR. Therefore, propagation of damage to the middle layer LM or the top layer LT may be prevented and/or reduced by the ground plane GP even when the weak region WKR of the bottom layer LB is damaged. Therefore, when a plain layer (LP) is disposed between the middle layer LM or the top layer LT and the bottom layer LB, no damage may occur, or damage may be reduced, even when the across signal wires SLa, which are some of the signal wires SL or SLa of the middle layer LM or the top layer LT, are disposed in the weak region WKR.

Figure 10A:
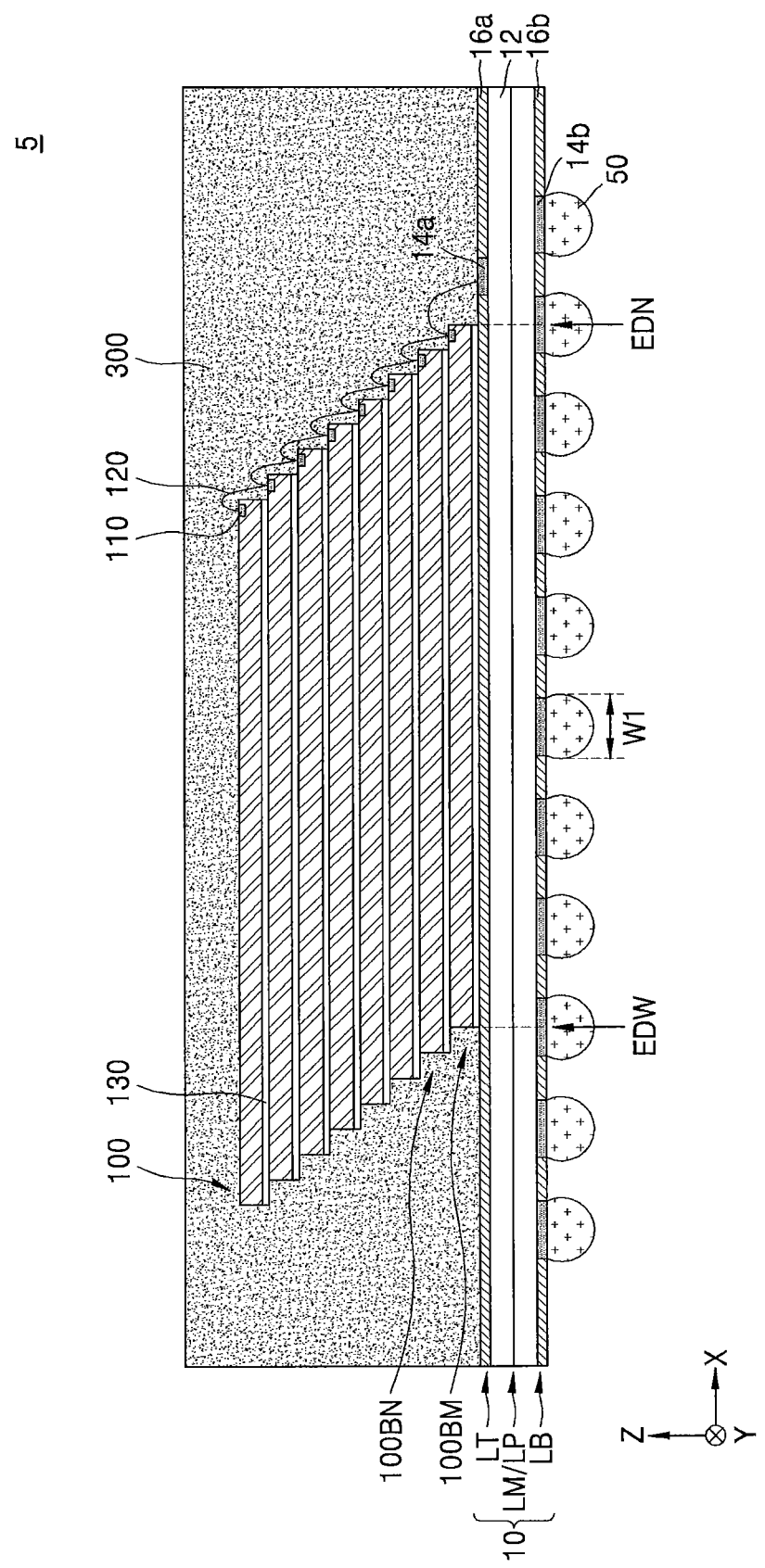
FIG. 10A is a cross-sectional view of a stacked semiconductor package according to an example embodiment of the inventive concepts.
Figure 10B:
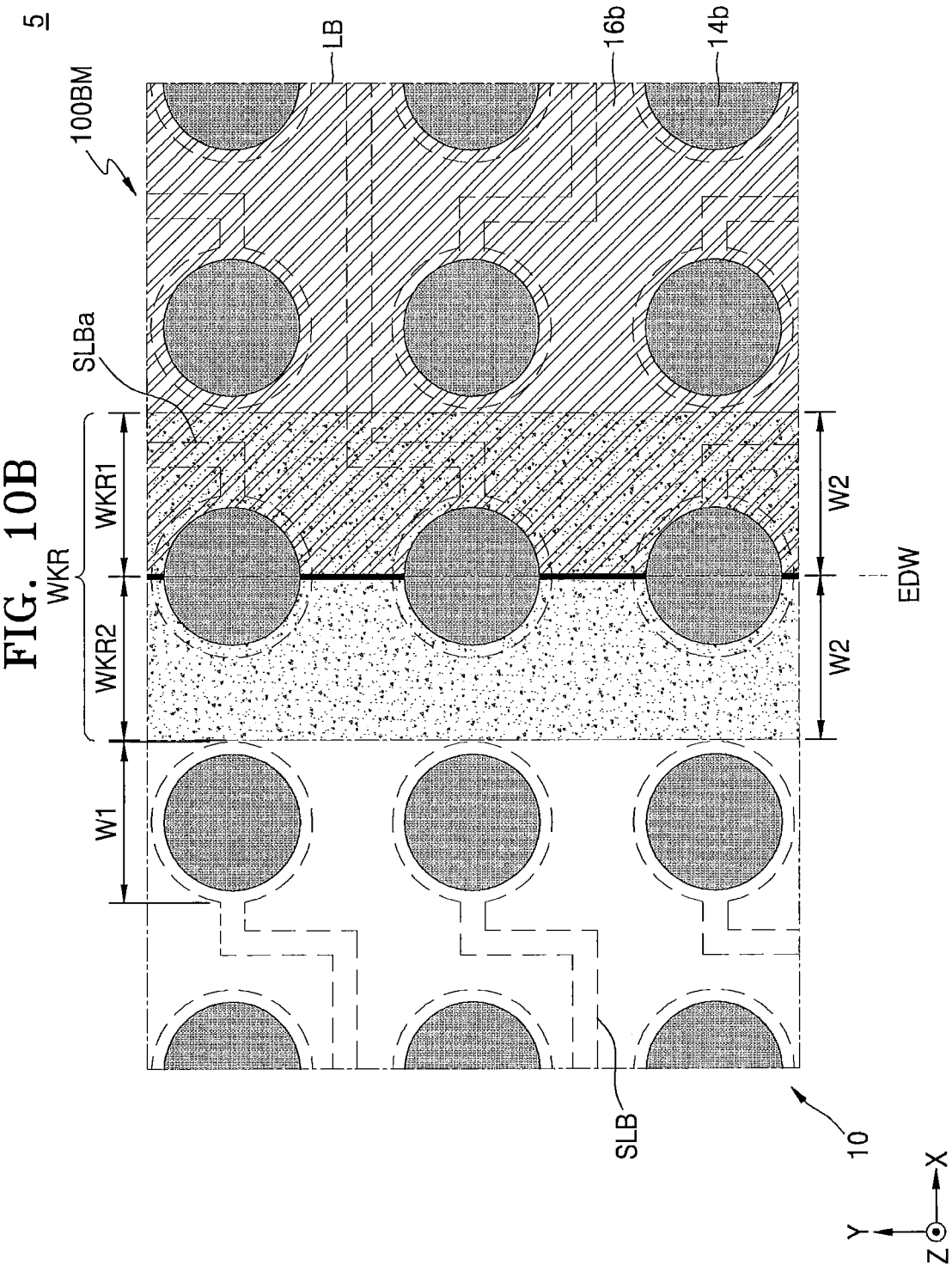
FIG. 10B is a plan view of a bottom layer of a package base substrate of the stacked semiconductor package.

FIG. 10A is a cross-sectional view of a stacked semiconductor package 5 according to an example embodiment of the inventive concepts, and FIG. 10B is a plan view of a bottom layer of a package base substrate 10 of the stacked semiconductor package 5.

Referring to FIGS. 10A and 10B, a stacked semiconductor package 5 may include the package base substrate 10, the semiconductor chips 100, the bottom surface connecting pads 14b disposed on the bottom surface of the package base substrate 10, and the signal wires SLB connected to the bottom surface connecting pads 14b.

Some of the bottom surface connecting pads 14b may be entirely disposed in the weak region WKR. The signal wire SLB connected to the bottom surface connecting pad 14b that is not entirely or partially disposed in the weak region WKR may not be disposed in the weak region WKR. However, at least a portion of a signal wire SLBa connected to the bottom surface connecting pad 14b that is entirely disposed in the weak region WKR may extend into the weak region WKR and be disposed in the weak region WKR. The bottom surface connecting pad 14b, which is entirely disposed in the weak region WKR, from among the bottom surface connecting pads 14b may be referred to as an in-area ball land. The signal wire SLBa, which is partially disposed in the weak region WKR, from among the signal wires SLB and SLBa may be referred to as an extension signal wire.

The weak region WKR may include a first region WKR1 below the first semiconductor chip 100BM, that is, a portion overlapping the first semiconductor chip 100BM in the vertical direction (e.g., the Z direction) and a second region WKR2, which is the remaining portion of the weak region WKR (e.g., a portion that does not overlap the first semiconductor chip 100BM in the vertical direction).

The extension signal wire SLBa may be disposed in the first region WKR1 of the weak region WKR and not in the second region WKR2. The first region WKR1 and the second region WKR2 may have the second width W2 based on portions of the package base substrate 10 overlapping the first edge EDW.

Since the first semiconductor chip 100BM is attached on the first region WKR1 of the package base substrate 10, damage is less likely to occur or to propagate as compared to the second region WKR2 on which the first semiconductor chip 100BM is not attached. Therefore, the extension signal wire SLBa may be disposed in the first region WKR1 but not in the second region WKR2, thereby preventing and/or reducing damage to the extension signal wire SLBa.

It will be understood that although the terms "first," "second," etc. are used herein to describe members, regions, layers, portions, sections, components, and/or elements in example embodiments of the inventive concepts, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concepts. For example, a first element may also be referred to as a second element, and similarly, a second element may also be referred to as a first element, without departing from the scope of the inventive concepts.

Spatially relative terms, such as "beneath," "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by those of ordinary skill in the art to which the inventive concepts pertain. It will also be understood that terms, such as those defined in commonly used dictionaries, should be interpreted as having a meaning that is consistent with their meaning in the context of this specification and the relevant art and will not be interpreted in an idealized or overly formal sense unless expressly so defined herein.

As used herein, the term "and/or" includes any and all combinations of one or more of the associated listed items. Expressions such as "at least one of," when preceding a list of elements, modify the entire list of elements and do not modify the individual elements of the list.

In the accompanying drawings, variations from the illustrated shapes as a result, for example, of manufacturing techniques and/or tolerances, are to be expected. Thus, the example embodiments of the inventive concepts should not be construed as being limited to the particular shapes of regions illustrated herein but may be construed to include deviations in shapes that result, for example, from a manufacturing process. For example, an etched region illustrated as a rectangular shape may be a rounded or certain curvature shape. Thus, the regions illustrated in the figures are schematic in nature, and the shapes of the regions illustrated in the figures are intended to illustrate particular shapes of regions of devices and not intended to limit the scope of the present inventive concepts.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

While the inventive concepts have been particularly shown and described with reference to embodiments thereof, it will be understood that various changes in form and details may be made therein without departing from the spirit and scope of the following claims.

What is claimed is:

1. A stacked semiconductor package comprising:
   a package base substrate comprising a top layer and a bottom layer, a plurality of signal wires, and at least one power wire, wherein a plurality of top surface connecting pads and a plurality of bottom surface connecting pads are on a top surface and a bottom surface of the package base substrate, respectively, and at least a portion of the plurality of signal wires are in at least one of the top layer or the bottom layer; and
   a plurality of semiconductor chips that are sequentially stacked on the top surface of the package base substrate and are electrically connected to the top surface connecting pads, the plurality of semiconductor chips comprising a first semiconductor chip that is a bottommost semiconductor chip of the plurality of semiconductor chips, and a second semiconductor chip that is on the first semiconductor chip,
   wherein portions of the plurality of signal wires extend in the package base substrate and are spaced apart from a first portion of the package base substrate that overlaps a first edge of the first semiconductor chip, the first edge overlapping the second semiconductor chip in a vertical direction,
   wherein at least one of the plurality of signal wires extends between the top surface and the bottom surface of the package base substrate in a second portion of the package base substrate that is overlapped in the vertical direction by the first semiconductor chip; and
   wherein each of the bottom surface connecting pads has a first width in a horizontal direction, and wherein the signal wires are spaced apart from the first portion of the package base substrate that overlaps the first edge by a second width in the horizontal direction equal to or greater than the first width.

2. The stacked semiconductor package of claim 1, wherein at least some of the signal wires pass through a third portion of the package base substrate that overlaps a second edge of the first semiconductor chip in the vertical direction, the second edge not overlapping the second semiconductor chip in the vertical direction.

3. The stacked semiconductor package of claim 1, wherein the second width is equal to or twice the first width.

4. The stacked semiconductor package of claim 1, wherein a portion of the at least one power wire is within the second width from the first portion of the package base substrate that overlaps the first edge of the first semiconductor chip in the vertical direction.

5. The stacked semiconductor package of claim 1, wherein the at least one power wire passes through the first portion of the package base substrate that overlaps the first edge of the first semiconductor chip in the vertical direction.

6. The stacked semiconductor package of claim 1, wherein the first edge comprises all edges of the first semiconductor chip.

7. The stacked semiconductor package of claim 1, wherein the first edge comprises one entire edge and portions of two other edges from among edges of the first semiconductor chip.

8. The stacked semiconductor package of claim 1, wherein the first edge comprises portions of two edges from among edges of the first semiconductor chip.

9. The stacked semiconductor package of claim 1, wherein at least a portion of the plurality of signal wires are in the top layer.

10. The stacked semiconductor package of claim 1, wherein at least a portion of the plurality of signal wires are in the bottom layer.

11. The stacked semiconductor package of claim 1, wherein the package base substrate comprises at least a middle layer between the top and bottom layers, and at least a portion of the plurality of signal wires are in the middle layer.

12. The stacked semiconductor package of claim 1, wherein at least one of the plurality of signal wires is enclosed by the second portion of the package base substrate that is overlapped in the vertical direction by the first semiconductor chip.

* * * * *